US009099484B2

(12) United States Patent
Fujii et al.

(10) Patent No.: US 9,099,484 B2
(45) Date of Patent: Aug. 4, 2015

(54) METHOD OF MANUFACTURING SEMICONDUCTOR DEVICE

(71) Applicant: Renesas Electronics Corporation, Kawasaki-shi (JP)

(72) Inventors: Hiroshi Fujii, Tokyo (JP); Shigeki Tanaka, Tokyo (JP); Kazuaki Yoshida, Tokyo (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 0 days.

(21) Appl. No.: 14/634,427

(22) Filed: Feb. 27, 2015

(65) Prior Publication Data

US 2015/0179480 A1 Jun. 25, 2015

Related U.S. Application Data

(63) Continuation of application No. 14/282,895, filed on May 20, 2014, now Pat. No. 8,999,761.

(30) Foreign Application Priority Data

May 27, 2013 (JP) ................................ 2013-111360

(51) Int. Cl.
*H01L 21/00* (2006.01)
*H01L 21/56* (2006.01)
*H01L 23/22* (2006.01)
*H01L 23/29* (2006.01)
*H01L 23/495* (2006.01)

(52) U.S. Cl.
CPC .............. *H01L 21/565* (2013.01); *H01L 23/22* (2013.01); *H01L 23/293* (2013.01); *H01L 23/495* (2013.01)

(58) Field of Classification Search
CPC .. H01L 23/22; H01L 23/23293; H01L 23/495
See application file for complete search history.

(56) References Cited

U.S. PATENT DOCUMENTS

| | | | |
|---|---|---|---|
| 7,468,556 B2 | 12/2008 | Logan et al. | |
| 7,470,601 B2 | 12/2008 | Bauer et al. | |
| 7,473,584 B1 | 1/2009 | Davis | |
| 8,399,302 B2 | 3/2013 | Tanaka et al. | |
| 2002/0020929 A1 | 2/2002 | Kasuga et al. | |
| 2014/0349447 A1 * | 11/2014 | Fujii et al. | 438/123 |

FOREIGN PATENT DOCUMENTS

| | | |
|---|---|---|
| JP | 2002-64114 A | 2/2002 |
| JP | 2011-258680 A | 12/2011 |

OTHER PUBLICATIONS

United States Notice of Allowance in co-pending U.S. Appl. No. 14/282,895 dated Dec. 8, 2014.

* cited by examiner

*Primary Examiner* — Richard Booth
(74) *Attorney, Agent, or Firm* — McGinn IP Law Group, PLLC

(57) ABSTRACT

A method of manufacturing a semiconductor device, includes providing a lead frame including a frame portion, including a through hole penetrating the lead frame, a device forming portion surrounded by the frame portion in plan view, including a die pad, and a semiconductor chip mounted on the die pad; after the providing step, sealing the semiconductor chip with sealing resin by supplying the sealing resin to the device forming portion via a first region of the frame portion in which the through hole is formed in plan view, thereby forming a sealing body sealing the device forming portion and the first region of the frame portion; and after the sealing step, removing a first part of the sealing body located at the first region of the frame portion from the lead frame by inserting a pin into the through hole.

4 Claims, 25 Drawing Sheets

METHOD OF MANUFACTURING SEMICONDUCTOR DEVICE

CROSS-REFERENCE TO RELATED APPLICATIONS

The present application is a Continuation Application of U.S. patent application Ser. No. 14/282,895, filed on May 20, 2014, which is based on Japanese Patent Application No. 2013-111360 filed on May 27, 2013, the entire contents of which are hereby incorporated by reference.

BACKGROUND

The present invention relates to a manufacturing technology of a semiconductor device, for example, a technology effective when applied to a semiconductor device obtained by supplying a resin from the corner of a cavity of a molding die to seal a semiconductor chip mounted on a leadframe.

Japanese Patent Laid-Open No. 2002-64114 (Patent Document 1) or Japanese Patent Laid-Open NO. 2011-258680 (Patent Document 2) describes a manufacturing method of a semiconductor device using a leadframe having a through-hole in a portion of a runner portion which will be a supply route of a resin.

Patent Document 1: Japanese Patent Laid-Open No. 2002-64114

Patent Document 2: Japanese Patent Laid-Open No. 2011-258680

SUMMARY

In a step of sealing a semiconductor chip mounted on a leadframe with a resin, there is a technology of supplying the resin by making use of a space at the periphery of a device forming portion of the leadframe. In this case, a resin body is formed not only in a device sealing portion for sealing a semiconductor chip at the device forming portion but also in a supply route of the resin formed around the device forming portion.

To readily conduct the steps after the sealing step, the resin body formed at the supply route of the resin is preferably removed. The resin however firmly attaches to the leadframe, making it difficult to remove the resin body stably.

The other problems and novel features will be apparent from the description herein and accompanying drawings.

A method of manufacturing a semiconductor device according to one embodiment includes a step of mounting a semiconductor chip on a leadframe. The leadframe has a first surface, a second surface opposite to the first surface, a frame portion, and a device forming portion surrounded by the frame portion in plan view. The frame portion is provided with a main-runner portion extending in a first direction, a gate portion linked with the device forming portion, and a sub-runner portion that links the gate portion with the main-runner portion. The main-runner portion and the sub-runner portion have a main-through-hole and a sub-through-hole, respectively. The sub-through-hole has, along an extending direction of the sub-runner portion, a first portion located on the side of the main-runner portion and a second portion located on the side of the gate portion relative to the first portion. In a plan view, the maximum opening width of the sub-through-hole in the extending direction of the sub-runner portion is greater than the maximum opening width of the sub-through-hole in a direction perpendicular to the extending direction of the sub-runner portion. In a plan view, the opening width of the sub-through-hole in the direction perpendicular to the extending direction of the sub-runner portion gradually decreases from the first portion to the end portion of the second portion on the side of the gate portion.

According to the above-mentioned one embodiment, the resin body formed at the supply route of a resin in the sealing step can be removed stably.

DETAILED DESCRIPTION

Figure 1:
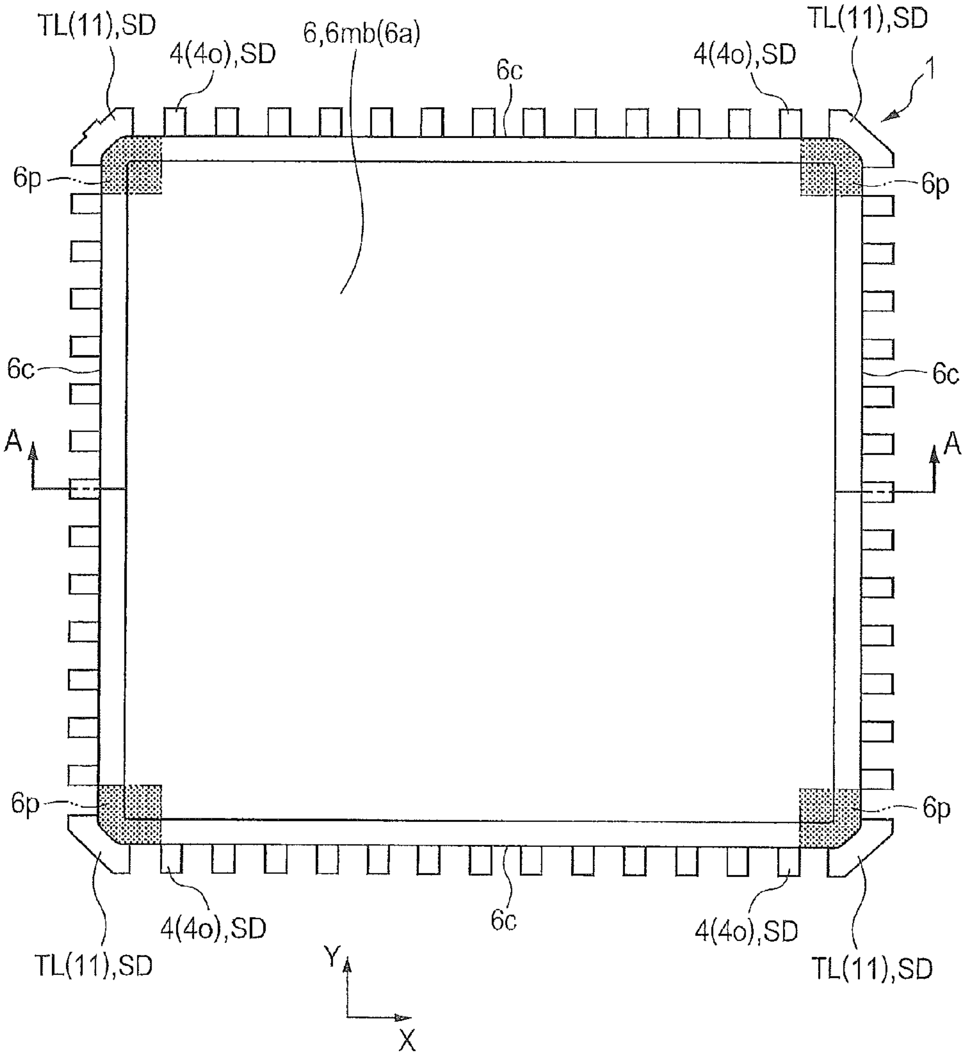
FIG. 1 is a top view of a semiconductor device according to one embodiment.

[Explanation on Description Manner, Basic Terms, and Usage in the Present Application]

In the present application, a description in the embodiment may be made after divided in a plurality of sections or the like if necessary for convenience sake. These sections are not independent from each other, but irrespective of the description order, they may each be a part of a single example or one of them may be a partial detail of the other or a modification example of a part or whole of the other one unless otherwise specifically indicated. In principle, a description on a portion similar to that described before is not repeated. Moreover, constituents in the embodiment are not essential unless otherwise specifically indicated that they are essential, limited to the number theoretically, or principally apparent from the context that they are essential.

Similarly, with regard to any material, any composition, or the like in the description of the embodiment or the like, the term "X made of A" or the like does not exclude a material having, as one of the main constituent components thereof, an element other than A unless otherwise specifically indicated or principally apparent from the context that the material does not contain the other element. For example, the term "X made of A" means that "X has A as a main component thereof". It is needless to say that, for example, the term "silicon member" is not limited to a member made of pure silicon but also means a member made of a SiGe alloy or another multi-element alloy having silicon as a main component or a member containing an additive in addition. The term "gold plating" "Cu layer", "nickel plating", or the like means not only a pure one but also a member containing gold, Cu, nickel, or the like as a main component, unless otherwise specified.

When a reference is made to a specific number or amount, the number or amount may be greater than or less than the specific number or amount unless otherwise specifically indicated, limited to the specific number or amount theoretically, or apparent from the context that it is not.

In all the drawings for describing the embodiment, the same or similar portion will be identified by the same or similar symbol or reference numeral and overlapping descriptions will be omitted in principle.

In the attached drawings, hatching or the like is sometimes omitted even from the cross-section when it makes the drawing cumbersome or when a member can be discriminated clearly from a vacant space. In relation thereto, a background outline may be omitted even from a two-dimensionally closed hole when it is obvious from the description or the like. On the other hand, even a portion other than a cross section may be hatched or shown with a dot pattern to clearly show that it is not a vacant space or clearly show a boundary between regions.

Embodiment

Figure 2:
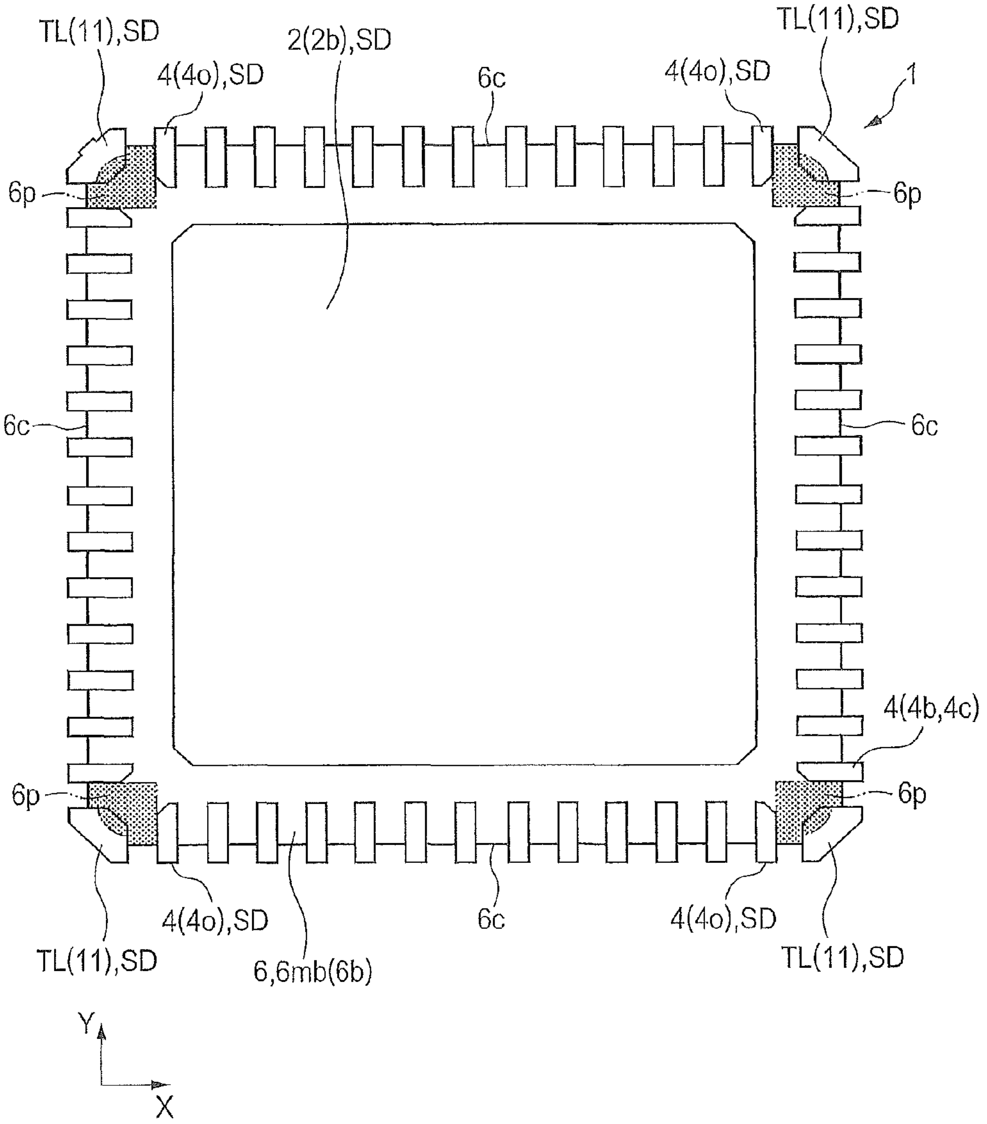
FIG. 2 is a bottom view showing the side of a mount surface of the semiconductor device shown in FIG. 1.
Figure 3:
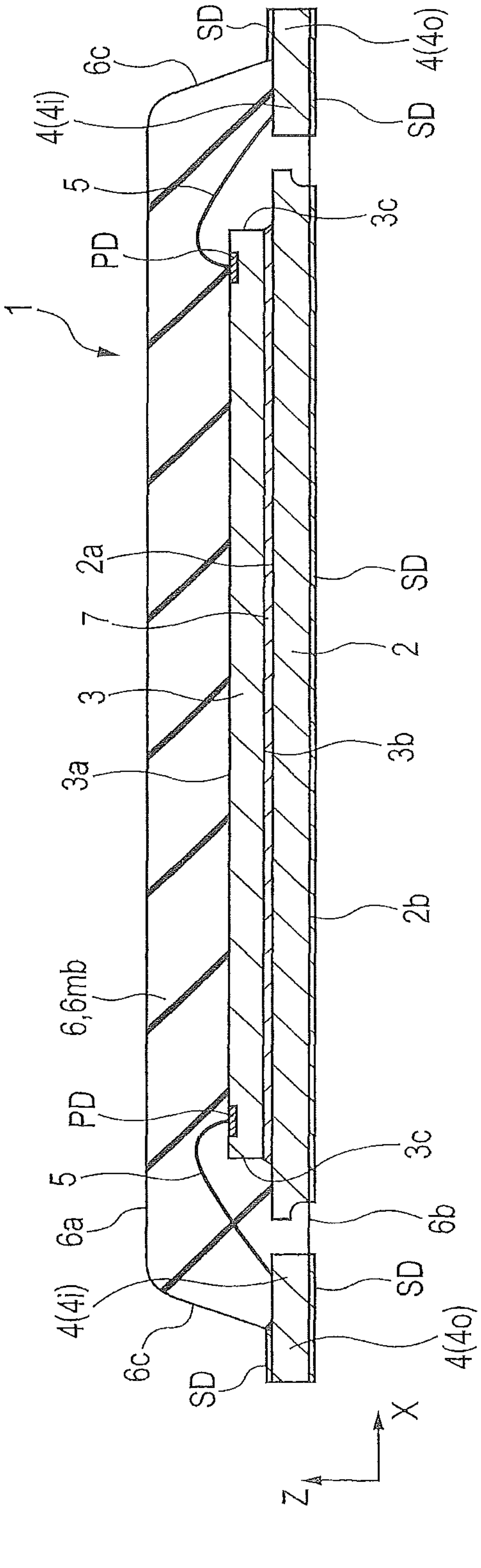
FIG. 3 is a cross-sectional view taken along the line A-A of FIG. 1.
Figure 4:
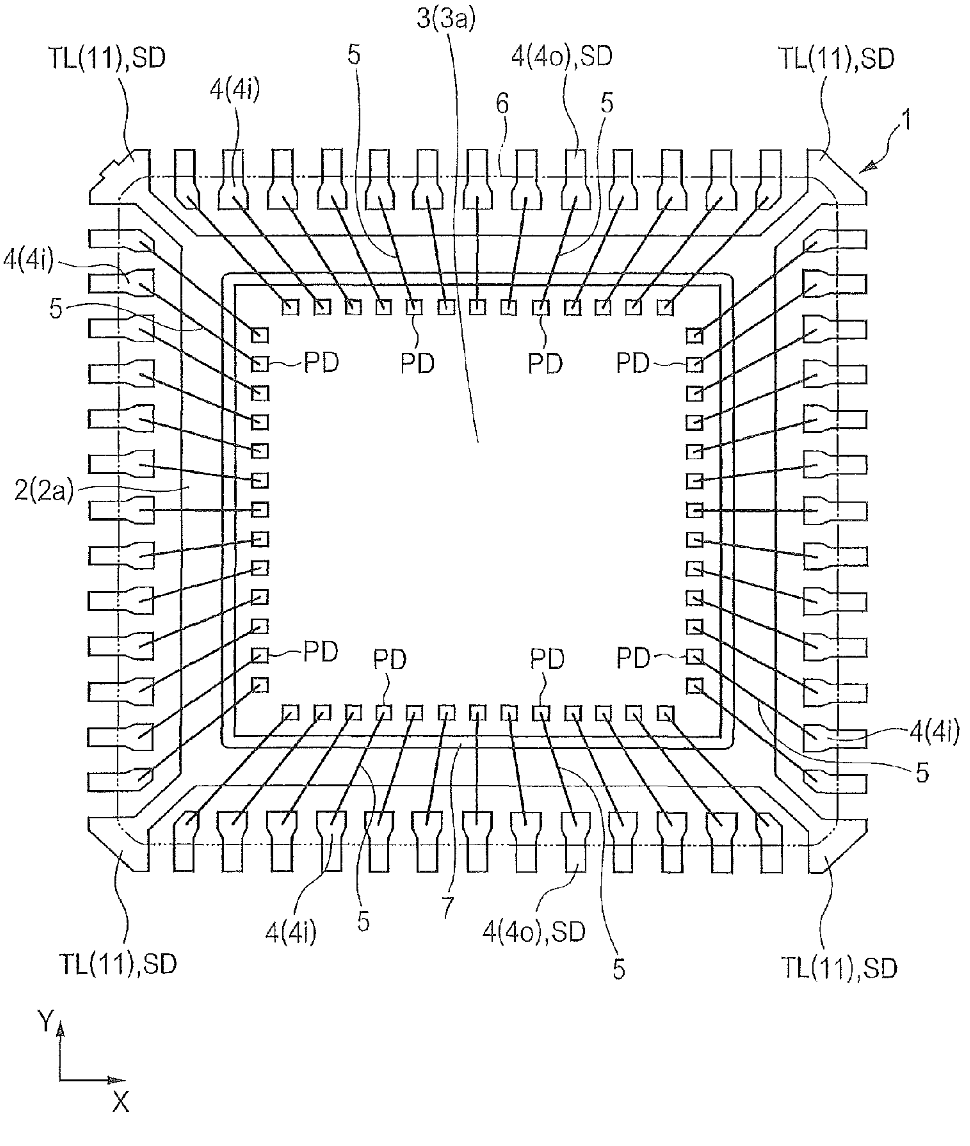
FIG. 4 is a perspective plan view showing an internal structure of the semiconductor device while seeing through the sealing body shown in FIG. 1.

The technology which will be described in the following embodiment can be applied to semiconductor devices of various package types that expose leads from the lower surface side of a sealing body. In the present embodiment, described as one example is a mode applied to a QFN (quad flat non-leaded package) type semiconductor device in which a plurality of leads serving as external terminals are exposed from a sealing body on the lower surface (mount surface) of the sealing body. FIG. 1 is a top view of a semiconductor device according to the embodiment; FIG. 2 is a bottom view showing the mount surface side of the semiconductor device shown in FIG. 1; and FIG. 3 is a cross-sectional view taken along the line A-A of FIG. 1. FIG. 4 is a perspective plan view showing an internal structure of the semiconductor device while seeing through the sealing body shown in FIG. 1.

<Semiconductor Device>

The outline of the configuration of a semiconductor device 1 of the present embodiment will be described referring to FIGS. 1 to 4. The semiconductor device 1 of the present embodiment is equipped with a die pad (chip mount portion, tab) 2 (refer to FIGS. 2 to 4) and a semiconductor chip 3 (refer to FIGS. 3 and 4) mounted on the die pad 2 via an adhesive material 7 (refer to FIGS. 3 and 4). The semiconductor device 1 also has a plurality of leads (terminals, external terminals) 4 arranged at the periphery of the semiconductor chip 3 (die pad 2) and a plurality of wires (conductive members) 5 (refer to FIG. 4) that electrically connect a plurality of pads (electrodes, bonding pads) PD (refer to FIG. 4) of the semiconductor chip 3 to the leads 4, respectively. With the die pad 2 is connected a plurality of suspending leads TL. The semiconductor device 1 is equipped further with a sealing body (resin body) 6 that seals the semiconductor chip 3, the wires 5, and a portion of each of the leads 4.

<External Structure>

First, the external structure of the semiconductor device 1 will be described. The sealing body (resin body) shown in FIG. 1 has a rectangular planar shape. The sealing body 6 has an upper surface 6*a*, a lower surface (back surface, mount surface) 6*b* (refer to FIG. 2) opposite to the upper surface 6*a*, and a side surface 6*c* located between the upper surface 6*a* and the lower surface 6*b*. The side surface 6*c* is, as illustrated in FIG. 3, an inclined surface perpendicular to neither the upper surface 6*a* nor the lower surface 6*b*.

A corner portion 6*p* of the sealing body 6 includes a neighboring region of a corner which is an intersection between any two crossing sides (two main sides) among the four sides (four main sides) of the sealing body 6. Strictly speaking, as shown in FIGS. 1 and 2, the corner portion 6*p* of the sealing body 6 is partially chamfered so that the intersection of the main sides is arranged outside of the corner portion 6*p* of the sealing body 6. The chamfered portion is small enough relative to the length of the main side so that the description herein will be made while regarding the center of the chamfered portion as the corner of the sealing body 6. Described specifically, the corner portion 6*p* is, in FIGS. 1 and 2, a region shown with a dot pattern and the boundary of it will be defined as follows. The semiconductor device 1 has a plurality of leads 4 along each of four sides of the sealing body 6. A region between two leads 4 arranged adjacent to the corner (center of the chamfered portion) of the sealing body 6, among the leads 4 arranged along each side, is defined as "corner portion". In the present application, the term "corner portion 6*p* of the sealing body 6" or "corner portion of a cavity" has therefore the above-mentioned meaning or content unless otherwise particularly specified that it has a different meaning or content.

As shown in FIGS. 1 and 2, the semiconductor device 1 has the plurality of leads 4 along each side (each main side) of the sealing body 6 having a rectangular planar shape. The leads 4 are each made of a metal material. In the present embodiment, they are each made of a stacked metal member obtained by stacking, for example, a metal film (not illustrated) made of nickel (Ni) on, for example, copper (Cu) or the surface of a base material made of copper (Cu). In the example shown in FIGS. 1 and 2, for example, leads having a width of 0.2 mm are arranged along each side with an arrangement pitch (distance between center lines) of 0.5 mm. The thickness of each of the leads 4 is, for example, 0.2 mm.

The lower surface (the lower surface of an inner portion 4*i* and the lower surface of an outer portion 4*o* shown in FIG. 3) of the leads 4 is exposed from the lower surface 6*b* of the sealing body 6. A portion (outer portion 4*o*) of the leads 4 is exposed also from the side surface 6*c* of the sealing body 6. Described specifically, a portion (outer portion 4*o*) of each of the leads 4 formed along each side of the sealing body 6 protrudes outward from the side surface 6*c* (side) of the sealing body 6 as shown in FIG. 3. In the example shown in FIG. 3, it protrudes outward by about 0.3 mm from the side surface 6*c* of the sealing body 6.

Although the details will be described later, when the semiconductor device 1 is mounted on an unillustrated mounting board, the leads 4 and terminals on the side of the mounting board are electrically connected via a connection member such as solder. By exposing the leads 4 from the lower surface 6*b* of the sealing body 6 and also from the side surface 6*c*, a bonding area between the connection material and the leads 4 increases, leading to improvement in the bonding strength.

As shown in FIGS. 1 to 3, the leads 4 have, on the surface of the exposed portion thereof (and the lower surface, upper surface, and side surface of the outer portion 4), a metal film SD made of, for example, a solder in order to improve the connectivity (wettability) between the leads 4 and a solder material (bonding material). This makes it possible to improve the wettability of the solder material further when the solder material is used as a connection material at the time of mounting.

The metal film SD (solder material) of the present embodiment is made of, for example, a solder not substantially containing lead (Pb), that is, a so-called lead-free solder. Examples of it include a solder composed only of tin (Sn), a tin-bismuth (Sn—Bi) solder, and a tin-copper-silver (Sn—Cu—Ag) solder. The term "lead-free solder" as used herein means a solder having a lead (Pb) content not greater than 0.1 wt %. This content has been determined as the standard of RoHS (Restriction of Hazardous Substances) instruction. A solder material or solder component described in the present embodiment will mean a lead-free solder unless otherwise specified that it is not.

As shown in FIG. 2, the lower surface 2*b* of the die pad 2 is exposed from the sealing body 6 at the lower surface 6*b* of the sealing body 6. This means that the semiconductor device 1 is a die pad exposed type (tab exposed type) semiconductor device. The die pad 2 is made of a metal material having a thermal conductivity greater than that of the sealing body 6. In the example shown in FIG. 2, it is made of a stacked metal member obtained by forming a metal film (not illustrated) made of, for example, nickel (Ni) on the surface of, for example, copper (Cu) or a base material made of copper (Cu). The die pad exposed type semiconductor device has thus a thermal conductivity greater than that of the sealing body 6. For example, by exposing the metal member (die pad 2) such as copper (Cu), the heat dissipation property of the package can be improved compared with a semiconductor device whose die pad 2 is not exposed. In the example shown in FIGS. 2 and 3, the die pad 2 has, on the lower surface 2*b* thereof, a metal film SD functioning as a bonding material during mounting and it covers the lower surface of the base material. The metal film SD is a plating film (solder film) formed, for example, by plating as described above.

As shown in FIGS. 1 and 2, in the semiconductor device 1, a portion of the suspending lead TL is exposed from the sealing body 6 on the outside of the corner portion 6*p* of the sealing body 6. Described specifically, as shown in FIG. 4, one of the end portions of the suspending lead TL is connected (integrally formed) with the die pad 2 and the other end (exposed portion 11) is exposed from the sealing body 6. The suspending lead TL is integrally formed with the die pad 2 so that the suspending lead including the exposed portions (fin, corner lead) 11 is made of the same metal material as that of the die pad 2. By exposing a portion of the suspending lead TL from the sealing body 6, the exposed portion 11 can be bonded to the terminal on the side of an unillustrated mounting board when the semiconductor device 1 is mounted on the unillustrated mounting board. This makes it possible to improve the mounting strength of the semiconductor device 1. In the example shown in FIGS. 1 to 3, the exposed portion 11 has, on the exposed surface thereof, the metal film SD made of, for example, a solder. This makes it possible to improve the mounting strength of the semiconductor device 1 further. A structure not having the exposed portion of the suspending lead TL as shown in FIG. 2 can be given as a modification example.

<Internal Structure>

Next, the internal structure of the semiconductor device 1 will be described. As shown in FIG. 4, the upper surface (chip mount surface) 2*a* of the die pad 2 has a rectangular (quadrangular) planar shape. In the present embodiment, it has, for example, a square shape. In the example shown in FIG. 4, the outer size (planar size) of the die pad 2 is greater than the outer size (planar size of the back surface 3*b*) of the semiconductor chip 3. Improved heat dissipation property can be achieved by mounting the semiconductor chip 3 on the die pad 2 having an area greater than the outer size of the semiconductor chip and exposing the lower surface 2*b* of the die pad 2 from the sealing body 6.

The die pad 2 has thereon the semiconductor chip 3 as shown in FIG. 4. The semiconductor chip 3 is mounted on the center of the die pad 2. As shown in FIG. 3, the semiconductor chip 3 is mounted on the die pad 2 via the adhesive material 7 while the back surface 3*b* faces to the upper surface 2*a* of the die pad 2. This means that a so-called face up mounting system in which a surface (back surface 3*b*) opposite to the surface (main surface) 3*a* having thereon the pads PD is caused to face to a chip mount surface (upper surface 2*a*). This adhesive material 7 is used for die bonding of the semiconductor chip 3. For example, an epoxy-based thermosetting resin can be used.

As shown in FIG. 4, the semiconductor chip 3 to be mounted on the die pad 2 has a rectangular planar shape. In the present embodiment, it has, for example, a square shape. As shown in FIG. 3, the semiconductor chip 3 has a surface (main surface, upper surface) 3*a*, a back surface (main surface, lower surface) 3*b* opposite to the surface 3*a*, and a side surface 3*c* located between the surface 3*a* and the back surface 3*b*. As shown in FIGS. 3 and 4, the semiconductor chip 3 has, on the surface 3*a* thereof, a plurality of pads (bonding pads) PD. In the present embodiment, the pads PD are formed along each of the sides of the surface 3*a*. Although not illustrated, the semiconductor chip 3 has, on the main surface (more specifically, semiconductor element formation region formed on the upper surface of the base material (semiconductor substrate) of the semiconductor chip 3) thereof, a plurality of semiconductor elements (circuit elements). The pads PD are electrically connected with the semiconductor elements via a wiring (not illustrated) formed in a wiring layer arranged inside the semiconductor chip 3 (more specifically, between the surface 3*a* and an unillustrated semiconductor element formation region).

The semiconductor chip 3 (more specifically, the base material of the semiconductor chip 3) is made of, for example, silicon (Si). It has, on the surface 3*a* thereof, an insulating film that covers therewith the base material of the semiconductor chip 3 and wiring. The surface of each of the pads PD is exposed from the insulating film in the opening portion formed therein. The pads PD are made of a metal and in the present embodiment, they are made of, for example, aluminum (Al) or an alloy layer composed mainly of aluminum (Al).

As shown in FIG. 4, the semiconductor chip 3 has, at the periphery thereof (more specifically, at the periphery of the die pad 2), a plurality of leads 4 which is, similar to the die pad 2, made of copper (Cu). The pads (bonding pads) PD formed on the surface 3*a* of the semiconductor chip 3 are electrically connected, via a plurality of wires (conductive members) 5, with the leads 4 (inner portions 4*i*) located inside the sealing body 6, respectively. The wires 5 are each made of, for example, gold (Au). A portion of the wires 5 (for example, one of the end portions) is bonded to the pad PD and the other portion (for example, the other end portion) is bonded to a bonding region of the inner portion 4*i*. Although not illustrated, the bonding region of the inner portion 4*i* has, on the surface thereof (more specifically, surface of a plating film made of nickel (Ni)), a plating film. The plating film is made of, for example, silver (Ag) or gold (Au). The bonding strength with the wire 5 made of gold (Au) can be improved by forming a plating film made of silver (Ag) or gold (Au) on the surface of the bonding region of the inner portion 4*i*.

As shown in FIG. 4, a plurality of suspending leads TL is connected (linked) with the die pad 2. These suspending leads TL are, at one of the end portions thereof, connected with the corner portion (corner) of the die pad 2. The suspending leads TL extend toward the corner portion 6*p* (refer to FIG. 1) of the sealing body 6 and are exposed from the sealing body 6 outside the corner portion 6*p*.

By extending the suspending leads TL toward the corner portion 6*p* (refer to FIG. 1) of the sealing body 6, the leads 4 can be arranged along each side (each main side) of the sealing body 6 without being disturbed so that the number of the leads 4, that is, the number of terminals of the semiconductor device 1 can be increased.

Although not illustrated, a portion (sealing portion) of the suspending lead TL which connects the die pad 2 with the exposure portion 11 is subjected to half etching processing from the lower surface side and the lower surface side is also sealed with the sealing body 6. This makes it possible to fix the suspending lead TL in the sealing body 6 and therefore prevent the suspending lead TL from dropping off from the sealing body 6.

<Manufacturing Steps of Semiconductor Device>

Figure 5:
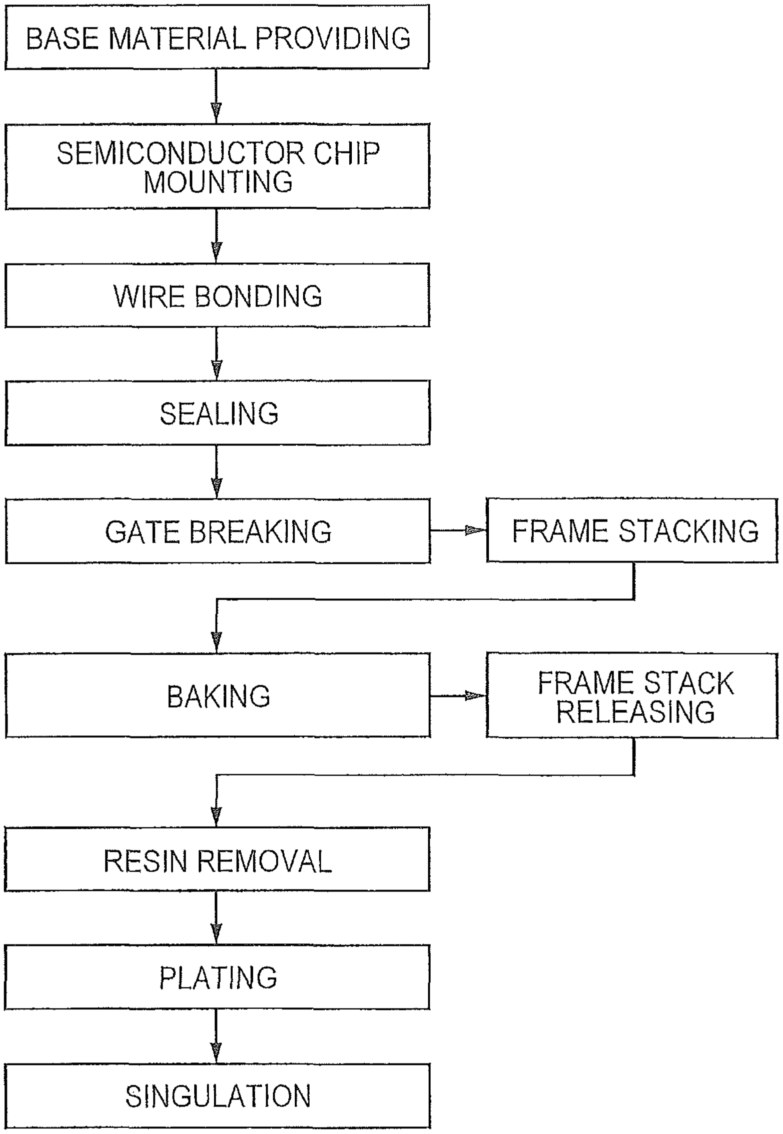
FIG. 5 is an explanatory view showing a fabrication flow of the semiconductor device shown in FIGS. 1 to 4.

Next, manufacturing steps of the semiconductor device 1 shown in FIGS. 1 to 4 will be described. The semiconductor device 1 according to the present embodiment is manufactured according to the fabrication flow shown in FIG. 5. FIG. 5 is an explanatory view showing the fabrication flow of the semiconductor device shown in FIGS. 1 to 4.

Figure 6:
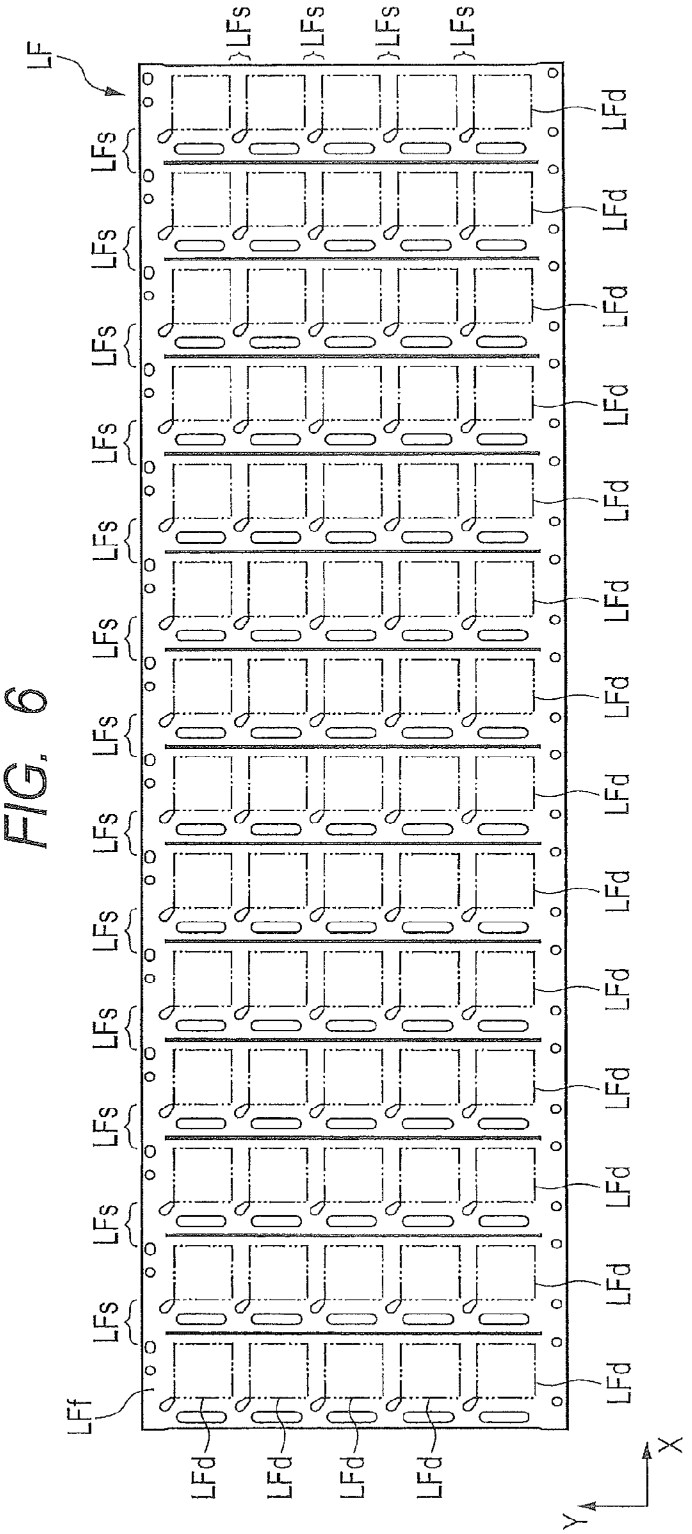
FIG. 6 is a plan view showing an entire structure of a leadframe to be provided in the base-material providing step shown in FIG. 5.

1. Base Material Providing Step:

First, as the base material providing step shown in FIG. 5, a leadframe (base material) LF as shown in FIG. 6 is provided. FIG. 6 is a plan view showing an entire structure of a leadframe to be provided in the base material providing step shown in FIG. 5; and FIG. 7 is an enlarged plan view of one of the plurality of device forming portions shown in FIG. 6.

The leadframe LF provided in this step has an upper surface LFa and a lower surface LFb (refer to FIG. 17 which will be described later) opposite to the upper surface LFa. The leadframe LF has, inside the outer frame LFf thereof, a plurality of device forming portions (device regions, product formation portions, product regions) LFd. The device forming portions LFd each have an upper surface region which is a portion of the upper surface LFa of the leadframe LF and a lower surface region which is a portion of the lower surface LFb of the leadframe. In the example shown in FIG. 6, the leadframe LF has 14 device forming portions LFd in the row direction (direction X) and 5 device forming portions LFd in the column direction (direction Y) and it has in total 70 device forming portions LFd in a matrix form. The leadframe LF is made of a metal. In the present embodiment, it is made of a stacked metal film formed by stacking a metal film (not illustrated) made of, for example, nickel (Ni) on the surface of, for example, copper (Cu) or a base material made of copper (Cu).

The device forming portions LFd each have, at the periphery thereof, a frame portion LFs so as to surround the periphery of each of the device forming portions LFd. The frame portion LFs has an upper surface region which is a portion of the upper surface LFa of the leadframe LF and a lower surface region which is a portion of the lower surface LFb of the leadframe. The frame portion LFs surrounds the periphery of the leads 4 as shown in FIG. 7. In a sealing step (refer to FIG. 5) which will be described later, a portion of the frame portion LFs is supplied as a supply route of a resin. The frame portion LFs is a region cut in a singulation step (refer to FIG. 5) which will be described later.

Figure 7:
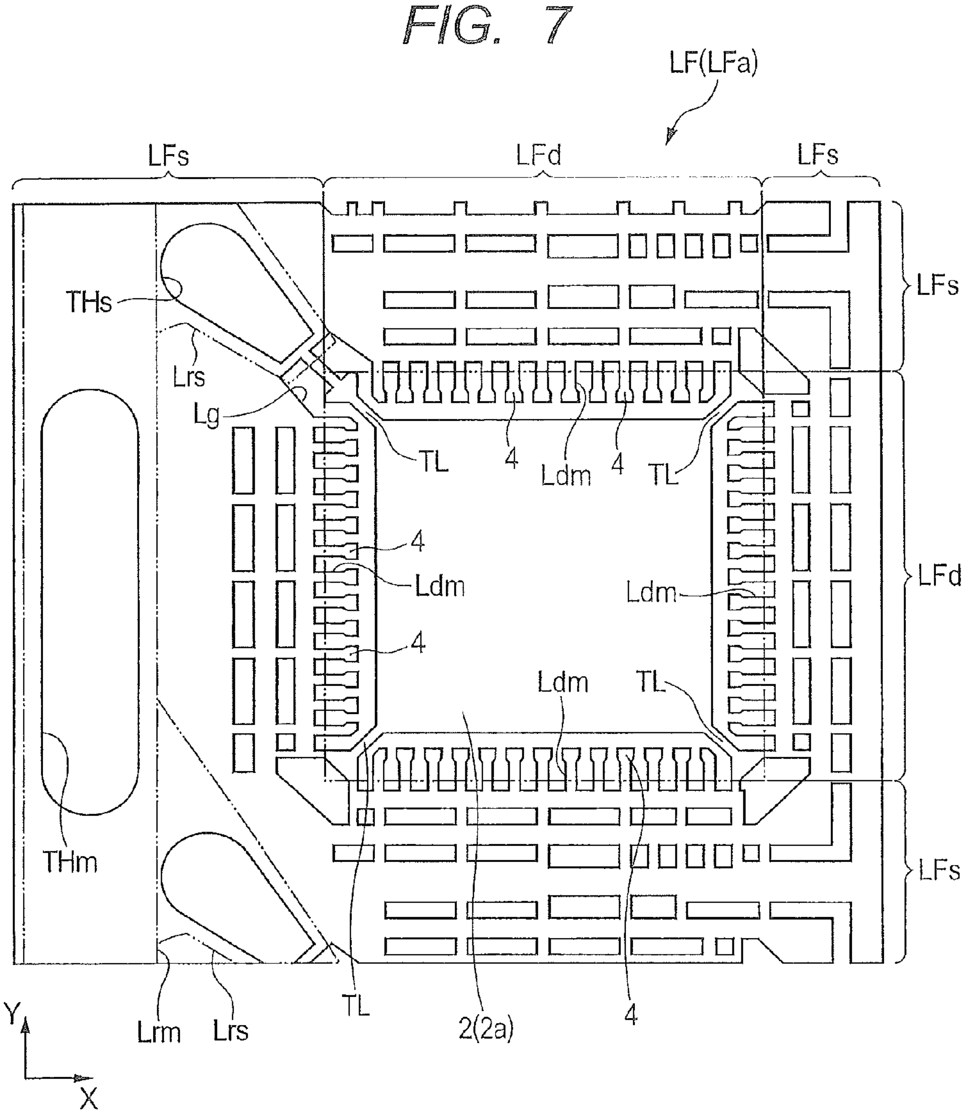
FIG. 7 is an enlarged plan view of one of the plurality of device forming portions shown in FIG. 6.

As shown in FIG. 7, the device forming portions LFd each have, at the center portion thereof, a die pad 2 which has a rectangular shape in plan view. One of the end portions of each of the suspending leads TL is connected with each of the four corner portions of die pad 2 and it is arranged so as to extend toward the corner portion of the device forming portion LFd. The other end of the suspending lead TL is connected with the frame portion LFs. The die pad 2 links to the frame portion LFs via the suspending lead TL and is supported by the frame LFs.

At the periphery of the die pad 2, the suspending leads TL have therebetween the leads 4. The leads 4 are each connected with the frame LFs arranged outside of the leads 4 relative to the die pad 2. The frame portion LFs is formed integrally with the leads 4, the suspending lead TL, and the die pad 2.

As shown in FIG. 7, the leads 4 adjacent to each other have therebetween a dam portion Ldm which is an interspace portion surrounded by the side surface of one of the leads 4, the lead 4 adjacent thereto, and the frame portion LFs. The dam portion Ldm is formed between two leads 2 adjacent to each other.

As shown in FIG. 7, the frame portion LFs of the leadframe is provided with a main-runner portion Lrm extending along the direction Y, a gate portion Lg linked with one of the corner portions of the device forming portion LFd, and a sub-runner portion Lrs that links between the gate portion Lg and the main-runner portion.

This main-runner portion Lrm, sub-runner portion Lrs, and gate portion Lg serve, in the sealing step shown in FIG. 5, a resin supply route for supplying a resin in a cavity of a molding die arranged in the device forming portion LFd. Although the details will be described later, in the sealing step of the present embodiment, a resin is supplied using a so-called side gate system in which the gate portion Lg, that is, a supply port of a resin is arranged on the side of the side surface of the cavity. Therefore, a portion of the frame LFs of the leadframe LF is utilized as a supply route of a resin.

As shown in FIG. 7, the main-runner portion Lrm has a main-through-hole THm and the sub-runner portion Lrs has a sub-through-hole THs. The main-through-hole THm and the sub-through-hole THs are through-holes formed for removing a resin body formed in the main-runner portion Lrm and the sub-runner portion Lrs in the gate breaking step shown in FIG. 5. They are formed so as to penetrate from one of the upper surface LFa and the lower surface LFb (refer to FIG. 17 which will be described later) of the leadframe to the other surface. The shape of the main-through-hole THm and the sub-through-hole THs will be described in detail later.

Figure 8:
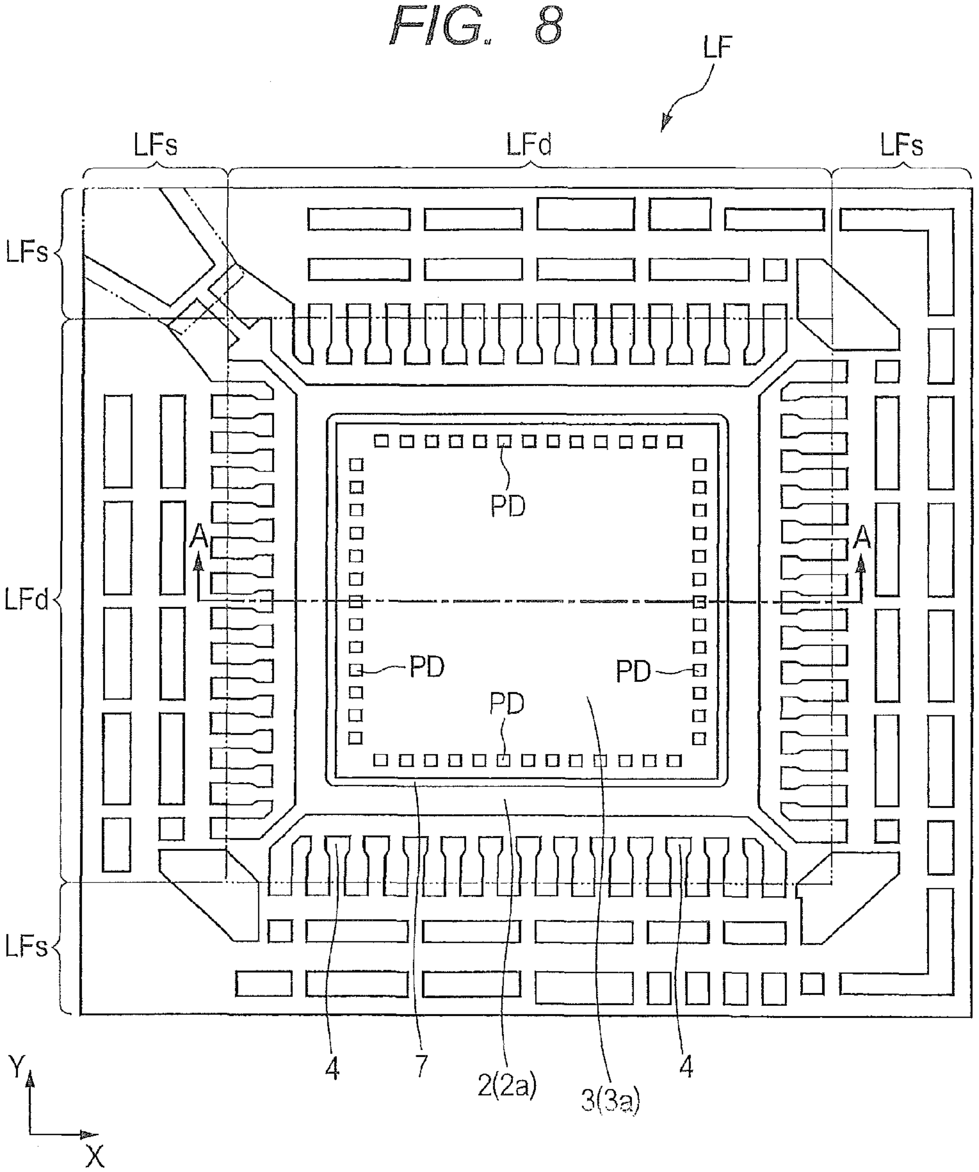
FIG. 8 is an enlarged plan view showing a semiconductor chip mounted on the die pad shown in FIG. 7 via a bonding material.
Figure 9:
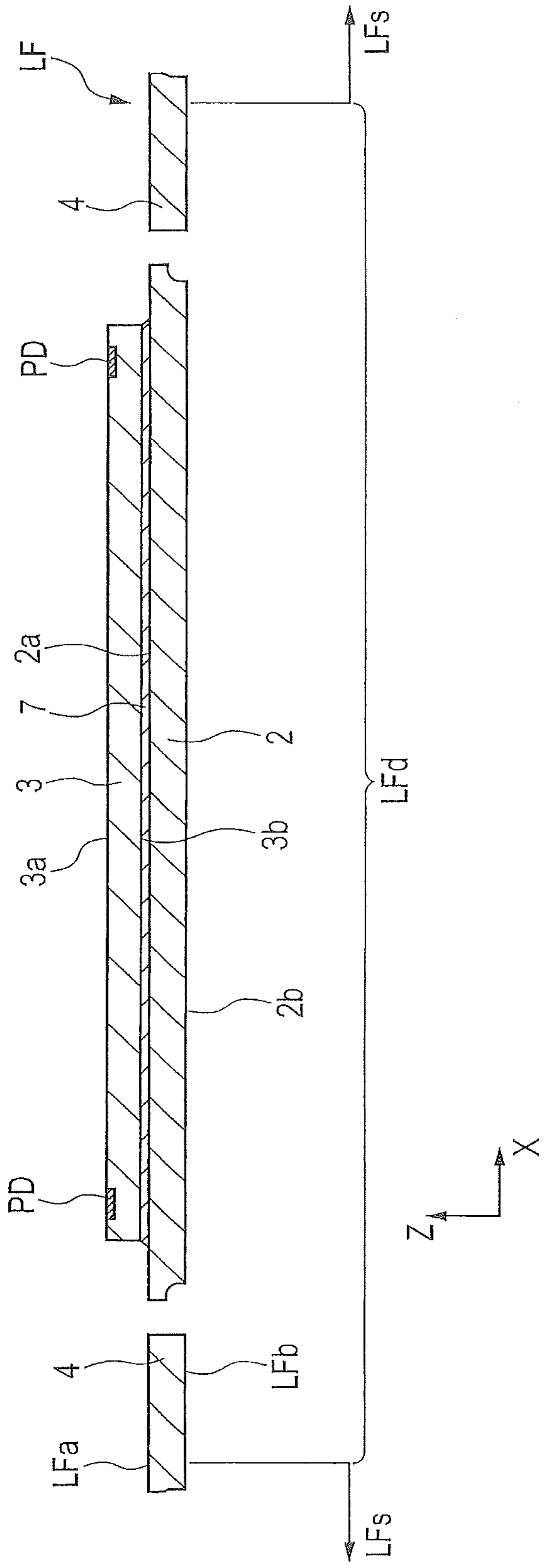
FIG. 9 is an enlarged cross-sectional view taken along the line A-A of FIG. 8.

2. Semiconductor Chip Mounting Step:

As the semiconductor chip mounting step shown in FIG. 5, the semiconductor chip 3 is then mounted on the die pad 2 via an adhesive material 7 as shown in FIGS. 8 and 9. FIG. 8 is an enlarged plan view showing a semiconductor chip mounted on the die pad shown in FIG. 7 via a bonding material; and FIG. 9 is an enlarged cross-sectional view taken along the line A-A of FIG. 8.

In the example shown in FIG. 9 employed is a so-called face up mounting system in which the semiconductor chip 3 is mounted on the die pad 2 while causing the back surface 3*b* (the surface opposite to the surface 3*a* on which a plurality of pads PD have been formed) to face to the upper surface 2*a* of the die pad 2. As shown in FIG. 8, the semiconductor chip 3 is mounted at the center portion of the die pad 2 so that each side of the surface 3*a* is arranged along each side of the die pad 2.

In this step, the semiconductor chip 3 is mounted via the adhesive material 7 which is, for example, an epoxy-based thermosetting resin. The adhesive material 7 is a paste material having fluidity prior to setting (thermosetting). When such a paste material is used as the adhesive material 7, the semiconductor chip 3 is bonded and fixed onto the die pad 2 via the adhesive material 7 as shown in FIG. 9 by applying the adhesive material 7 onto the die pad 2, bonding the back surface 3*b* of the semiconductor chip 3 to the upper surface 2*a* of the die pad 2, and, after bonding, setting (for example, heat treating) the adhesive material 7.

In this step, the adhesive material 7 and the semiconductor chip 3 are arranged on the die pads 2 formed in the device forming portions respectively. The semiconductor chip 3 is then mounted on each of the device forming portions LFd.

In the present embodiment, the mode using a paste material made of a thermosetting resin as the adhesive material 7 was described, but various modification examples can be employed. For example, instead of using the paste material, it is possible to attach, as an adhesive material, a tape material (film material) having, on both surfaces thereof, an adhesive layer to the back surface 3*b* of the semiconductor chip 3 in advance and mount the semiconductor chip 3 on the die pad 2 via the tape material.

Figure 10:
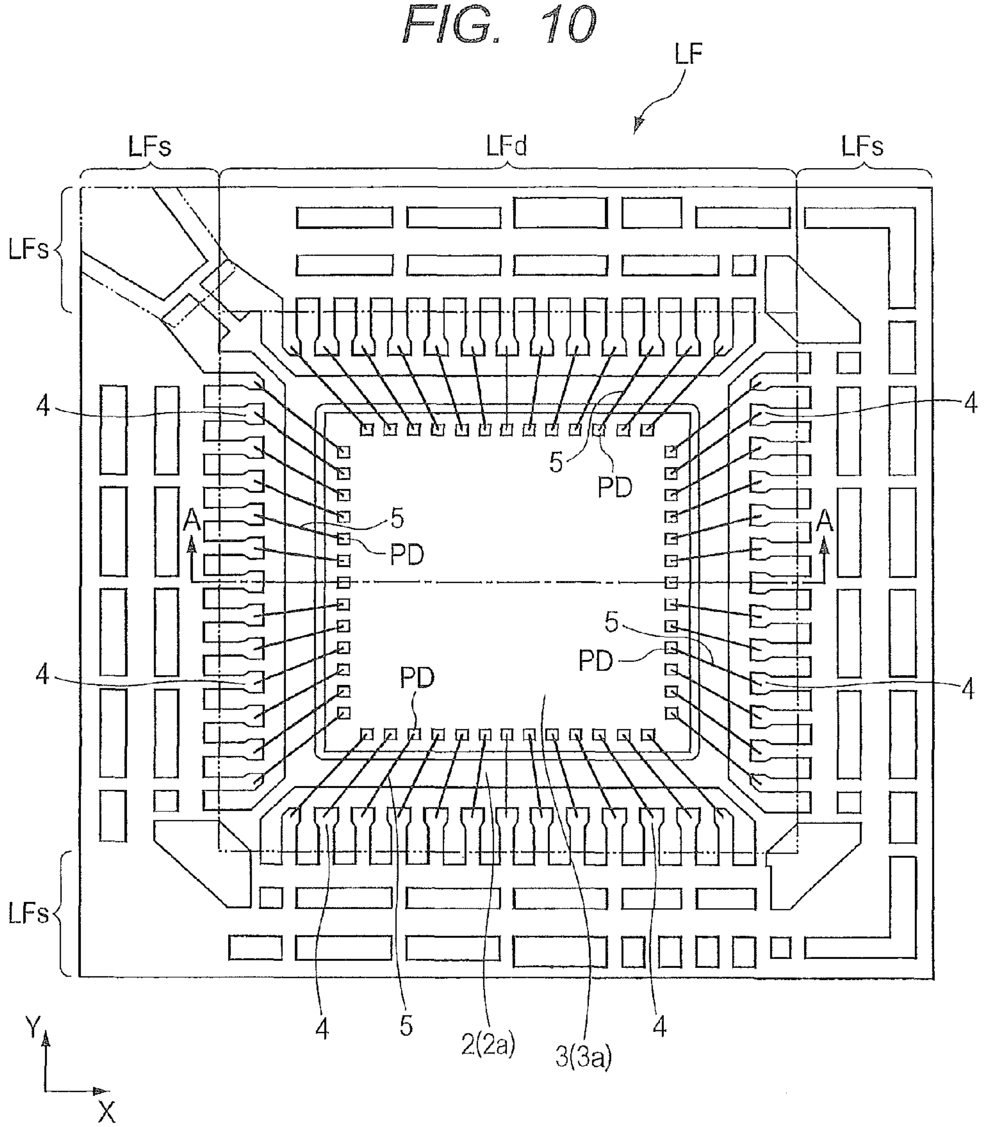
FIG. 10 is an enlarged plan view showing the semiconductor chip and the plurality of leads, which are shown in FIG. 8, electrically connected via wires.
Figure 11:
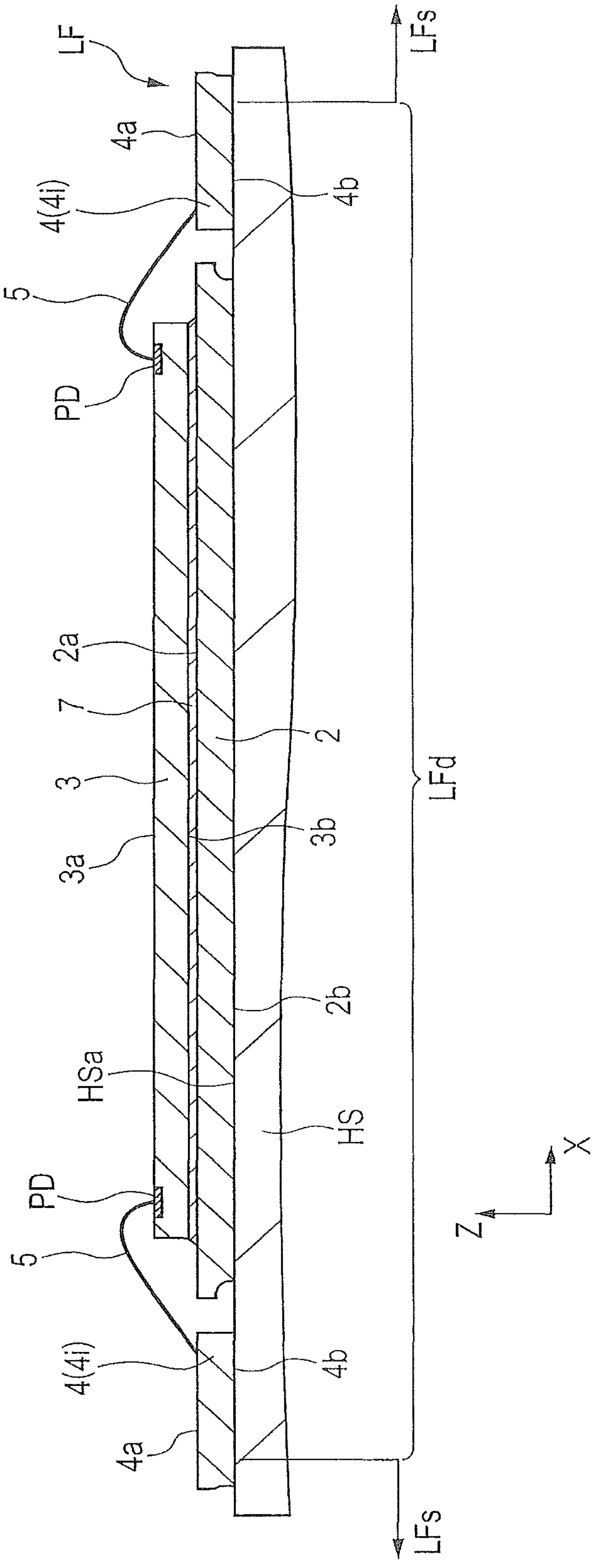
FIG. 11 is an enlarged cross-sectional view taken along the line A-A of FIG. 10.

3. Wire Bonding Step:

Next, as the wire bonding step shown in FIG. 5, the pads PD of the semiconductor chip 3 and the leads 4 are electrically connected via the wires (conductive members) 5, respectively, as shown in FIGS. 10 and 11. FIG. 10 is an enlarged plan view showing the semiconductor chip and a plurality of leads, which are shown in FIG. 8, electrically connected via wires; and FIG. 11 is an enlarged cross-sectional view taken along the line A-A of FIG. 10.

In this step, for example, the leadframe LF having the semiconductor chip 3 mounted on the die pad 2 of each of the device forming portions LFd is arranged on a heat stage (lead frame heat stage) HS. Then, the pad PD of the semiconductor chip 3 and the leads 4 are electrically connected via the wires 5. In the present embodiment, the wires 5 are connected with the leads by using a so-called nail head bonding system, more specifically, a system of supplying the wires 5 through an unillustrated capillary and bonding the wires 5 by using ultrasound and thermocompression bonding in combination.

The leads 4 have, on a portion thereof (a bonding region arranged at the end of the inner portion 4*i*), a plating film made of, for example, silver (Ag) or gold (Au). A portion of the wires 5 is electrically connected with the leads 4 via this plating film. The wires 5 are made of a metal and in the present embodiment, they are made of, for example, gold (Au).

In the example shown in FIG. 11, wire connection is conducted by using a so-called normal bonding system, more specifically, by connecting a portion (end portion) of the wires with the pad PD of the semiconductor chip 3 and then connecting the other portion of the wires 5 to a bonding region (a portion of the upper surface 4*a* of the leads 4) of the leads 4. The lower surface 4*b* located opposite to the bonding region is in contact with a mount surface HSa of the heat stage HS.

In the present step, the wires 5 are bonded to the leads 4 formed, respectively, in the device forming portions LFd. In each of the device forming portions LFd, the semiconductor chip 3 and the leads 4 are therefore electrically connected with each other via the wires 5.

Figure 12:
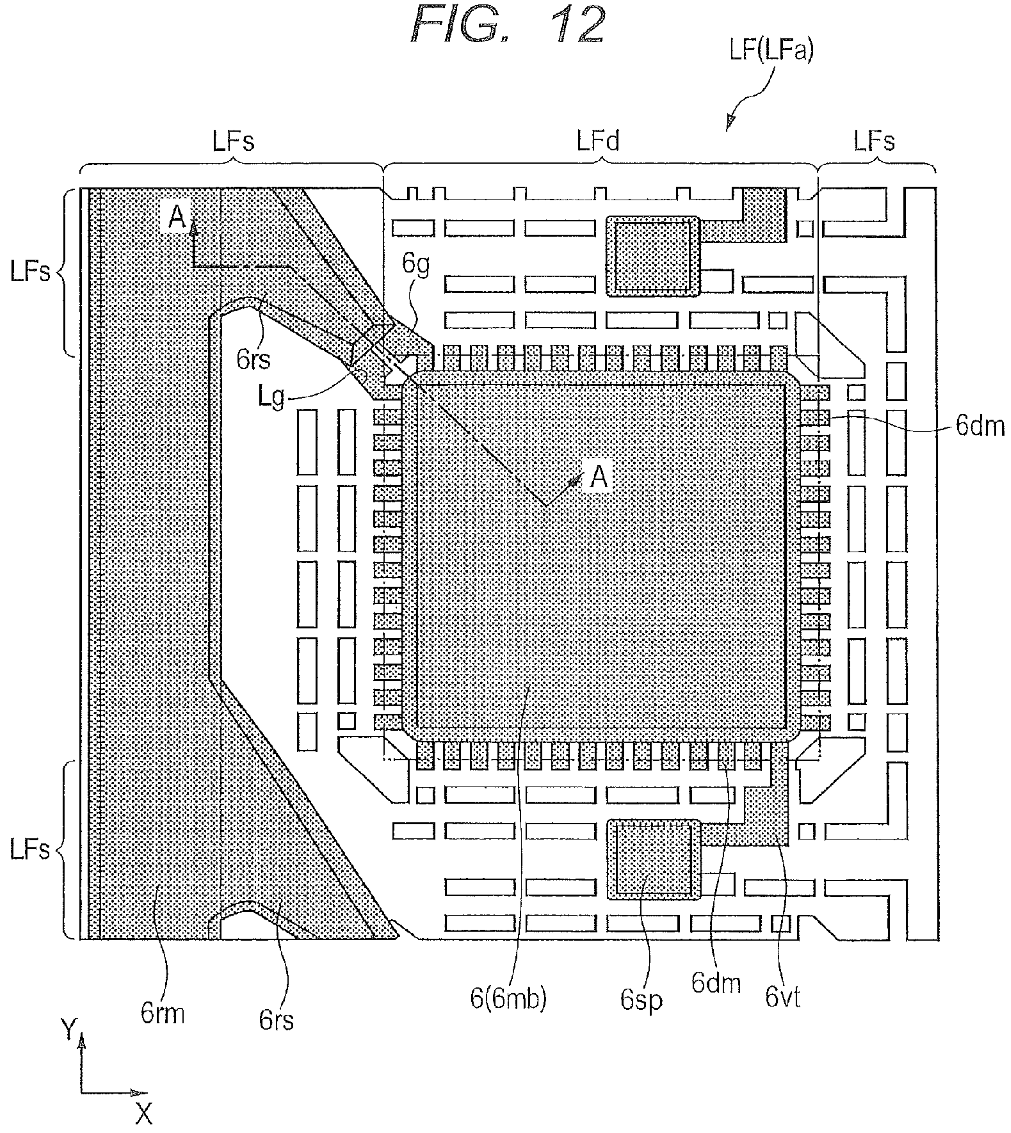
FIG. 12 is a plan view showing a sealing body formed in the device forming portion of the leadframe shown in FIG. 10.
Figure 13:
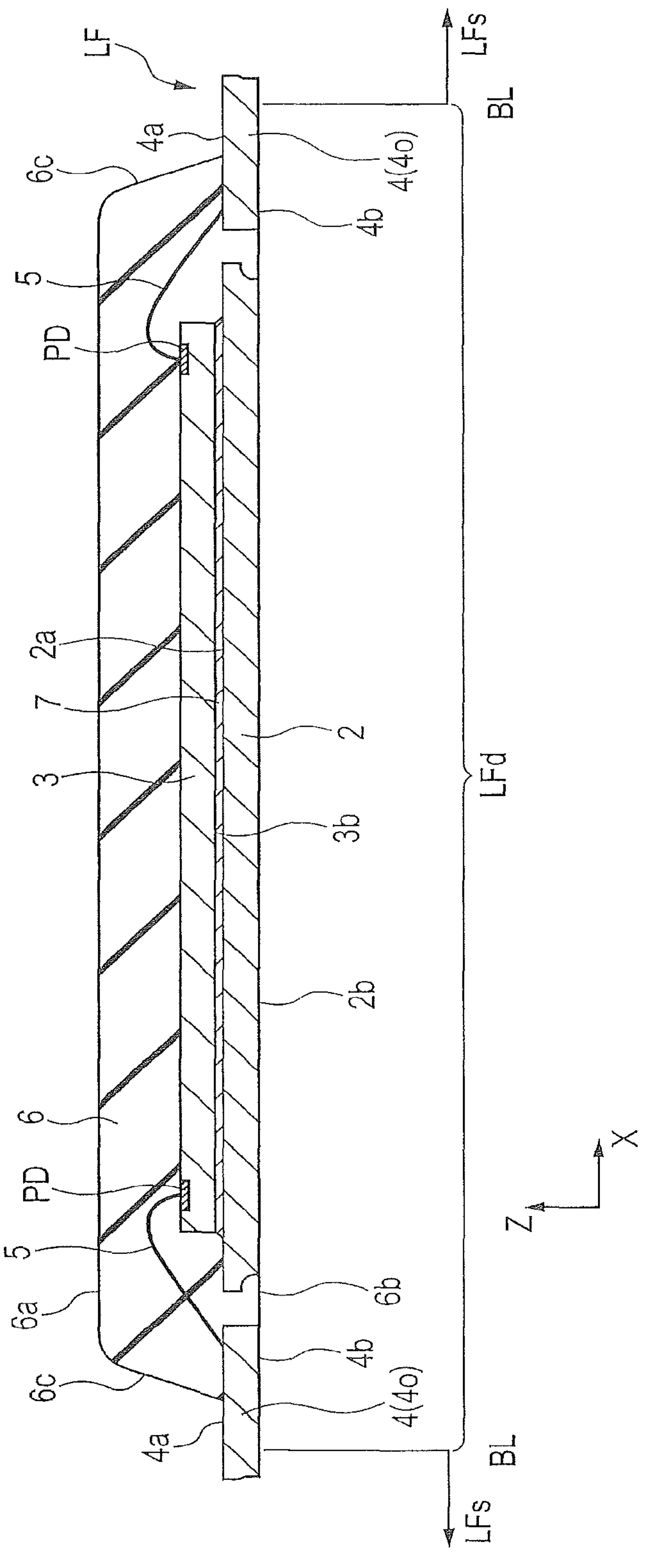
FIG. 13 is an enlarged cross-sectional view taken along the line A-A of FIG. 12.
Figure 14:
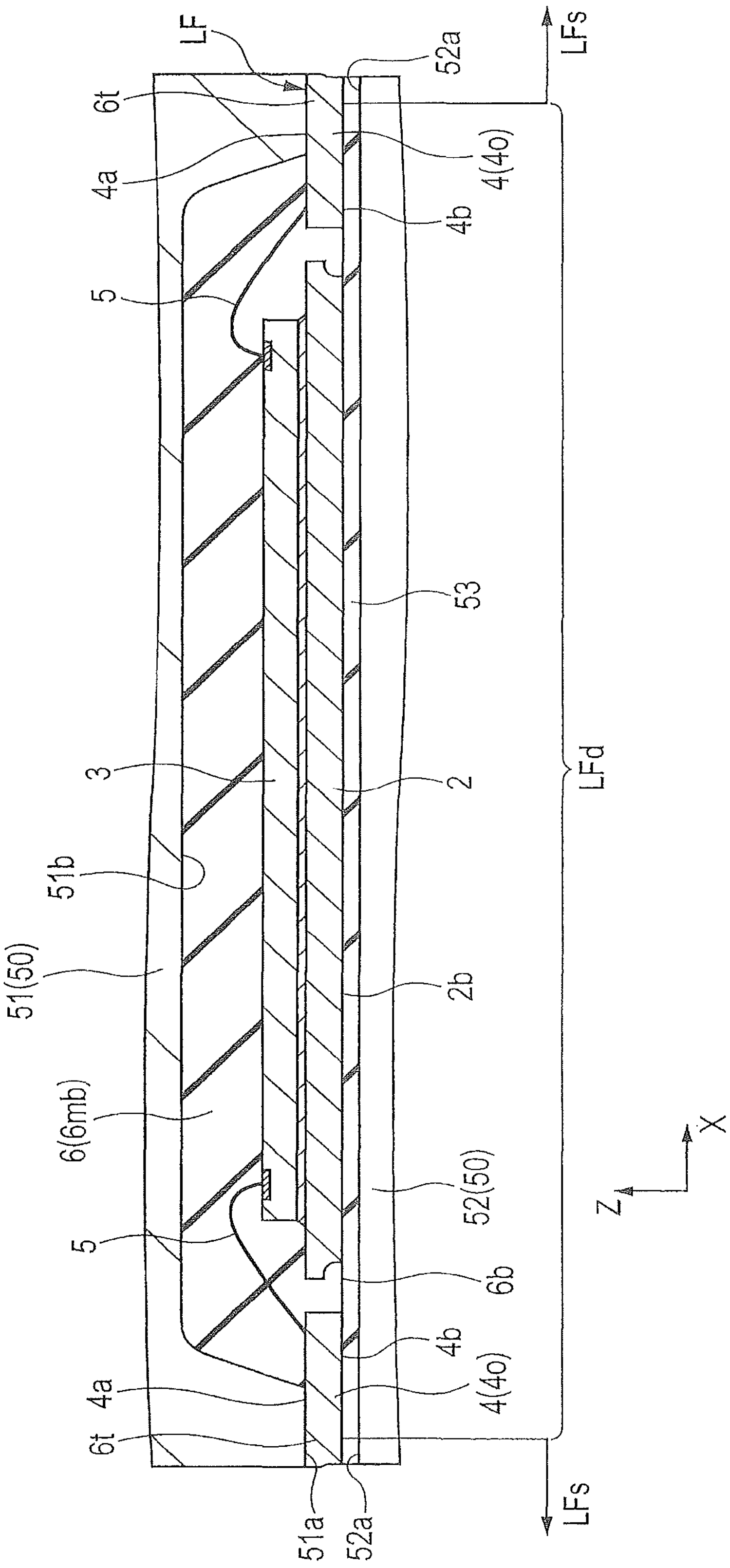
FIG. 14 is a cross-sectional view showing a leadframe arranged in a molding die in the sealing step shown in FIG. 5.
Figure 15:
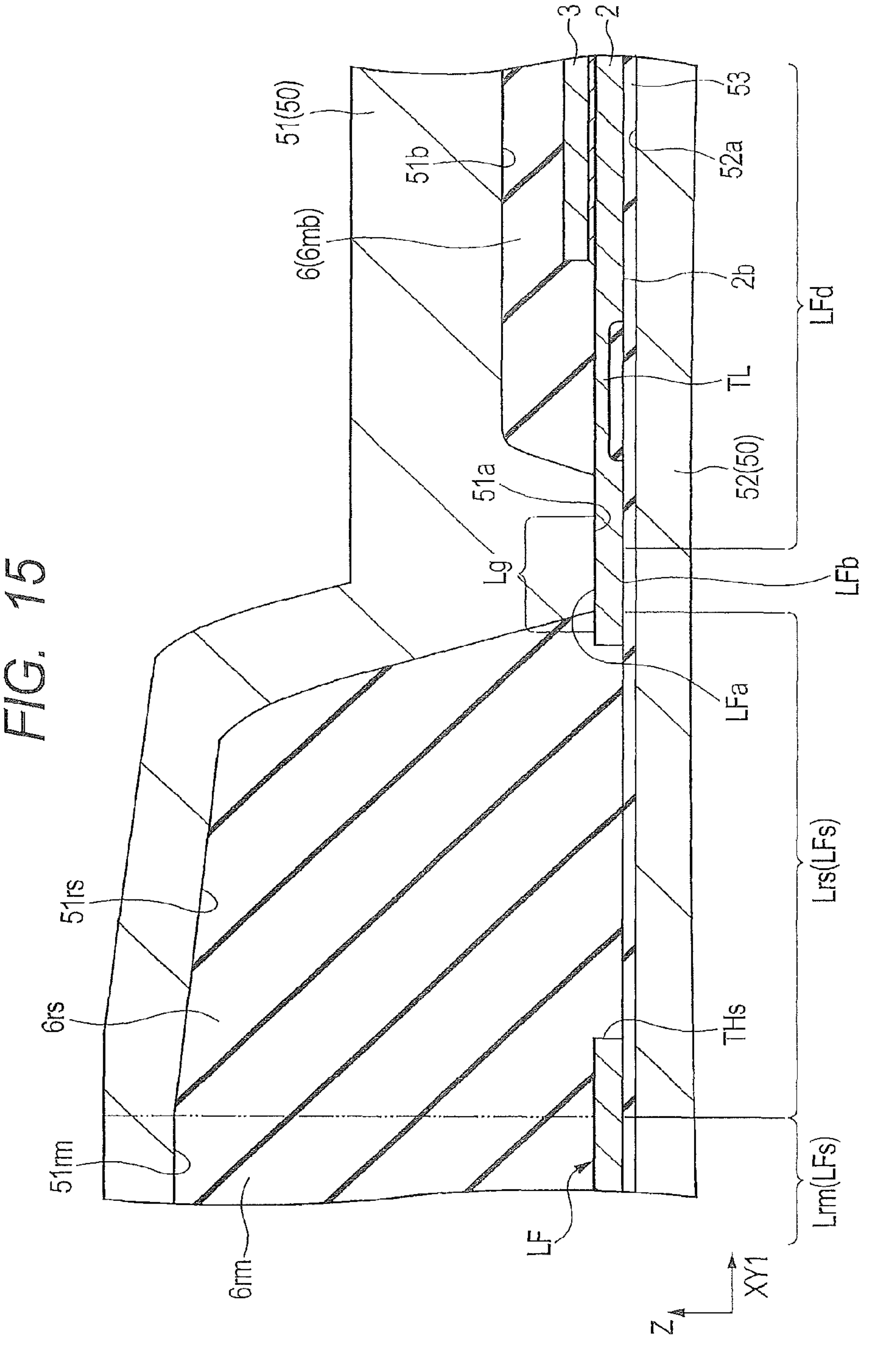
FIG. 15 is an enlarged cross-sectional view taken along the line A-A shown in FIG. 12 and showing the leadframe sandwiched with the molding die.
Figure 16:
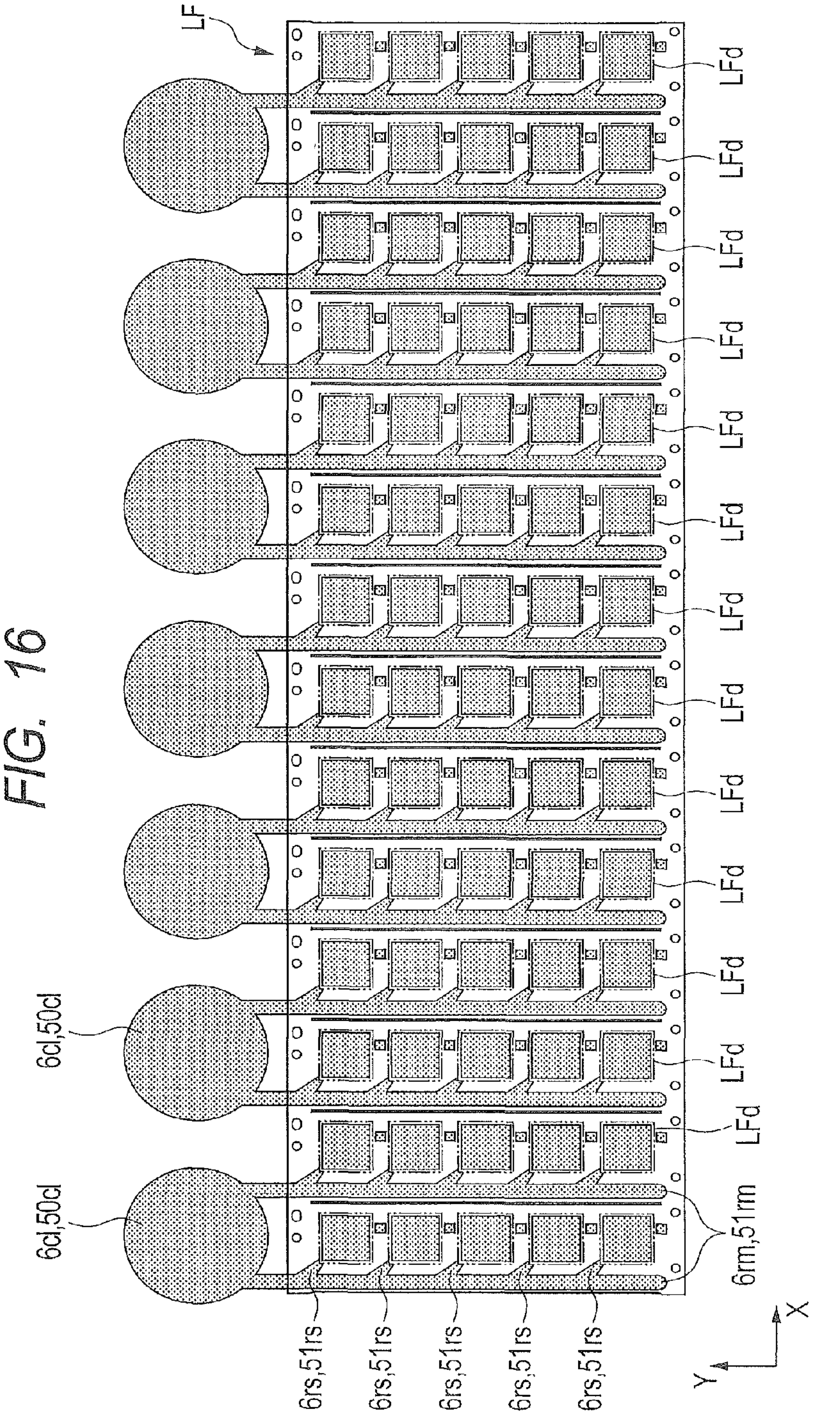
FIG. 16 is a plan view showing an example of the entire structure of the leadframe after the sealing body shown in FIG. 12 is formed.
Figure 17:
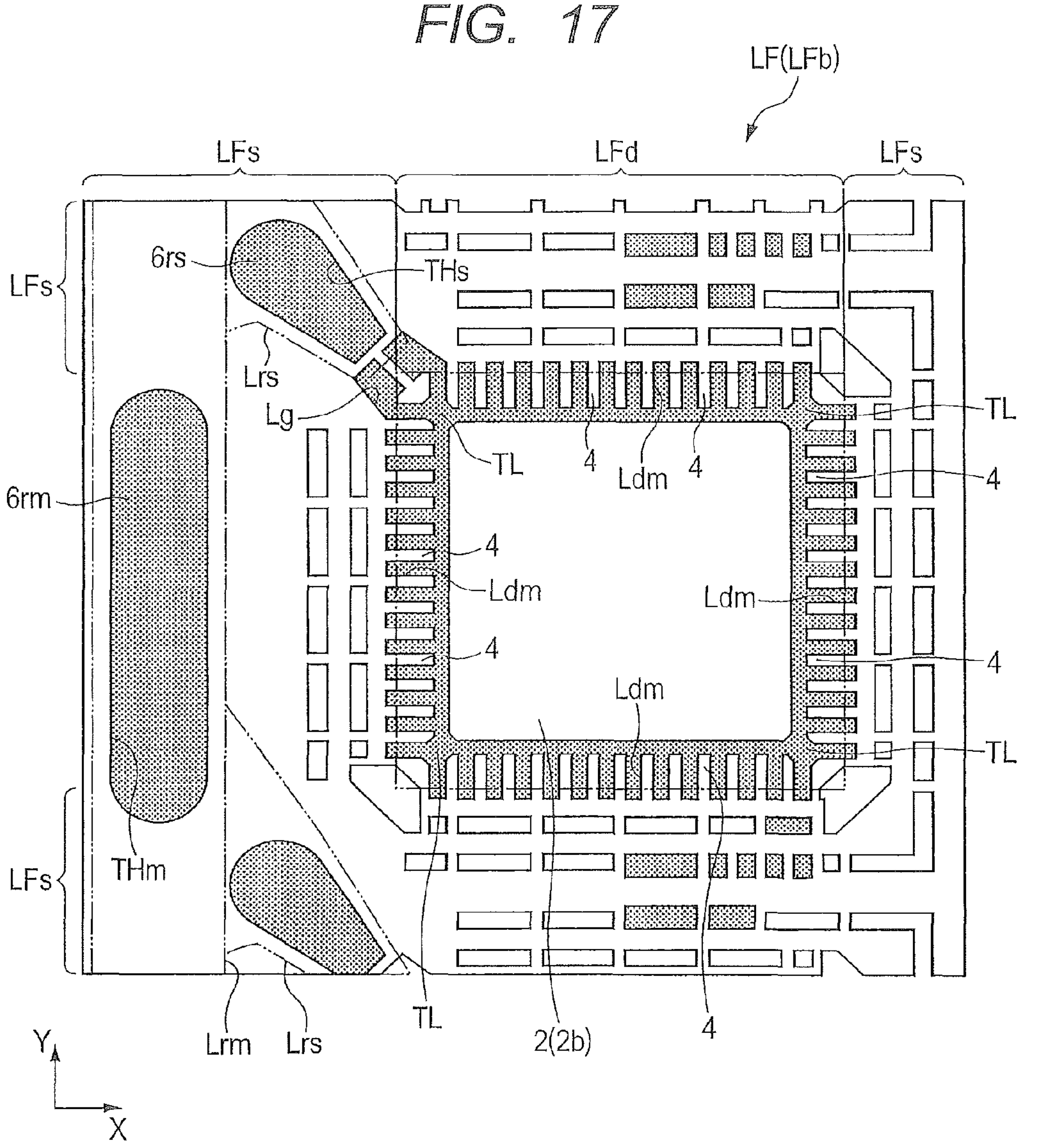
FIG. 17 is an enlarged plan view showing the side of the leadframe opposite to that shown in FIG. 12.

4. Sealing Step:

Next, as the sealing step shown in FIG. 5, a sealing body 6 is formed to seal the semiconductor chip 3 (refer to FIG. 13), the wires 5 (refer to FIG. 13), and a portion of each of the leads 4 (refer to FIG. 13) with a resin as shown in FIGS. 12 and 13. FIG. 12 is a plan view showing a sealing body formed in the device forming portion of the leadframe shown in FIG. 10; and FIG. 13 is an enlarged cross-sectional view taken along the line A-A of FIG. 12. FIG. 14 is a cross-sectional view showing a leadframe arranged in a molding die in the sealing step shown in FIG. 5. FIG. 15 is an enlarged cross-sectional view taken along the line A-A shown in FIG. 12 and showing the leadframe sandwiched with the molding die. FIG. 16 is a plan view showing an example of the entire structure of the leadframe after the sealing body shown in FIG. 12 is formed. FIG. 17 is an enlarged plan view showing the side of the leadframe opposite to that shown in FIG. 12. FIG. 16 shows a sealing portion (resin body) formed by supplying a resin to the molding die shown in FIGS. 13 and 14. To facilitate understanding of the planar shape of a molding die 50, both the symbol of each of the sealing portions and the symbol of constituent of the molding die are added.

In this step, as shown in FIG. 13, a sealing body 6 that seals, with a resin, the semiconductor chip 3 mounted on the device forming portion LFd, a portion of each of the leads 4 formed in the device forming portion LFd, and the wires 5 that electrically connect the leads 4 and the semiconductor chip 4 is formed. In the example shown in FIG. 13, the sealing body 6 is formed so as to expose therefrom the lower surface 4*b* of the leads 4 formed in each of the device forming portions LFd. In the example shown in FIG. 13, the sealing body 6 is formed so as to expose the lower surface 2*b* of the die pad 2 formed in each of the device forming portions LFd.

In this step, the sealing body 6 is formed using a so-called transfer molding system, more specifically, for example, by pressing a softened resin into the molding die 50 while sandwiching the leadframe LF with the molding die 50 shown in FIG. 14 and then setting the resin.

As shown in FIG. 14, the molding die 50 is equipped with a upper mold (die) 51 arranged on the upper side of the leadframe LF and a lower mold (die) 52 arranged on the lower side of the leadframe LF. The upper mold 51 is equipped with a clamp face (die face, pressing face, face) 51*a* that presses the leadframe LF and a cavity (recessed portion) 51*b* formed inside the clamp face 51*a*. The lower mold 52 is equipped with a clamp face (die face, pressing face, face) 52*a* that is arranged so as to face to the clamp face 51*a* and presses the leadframe LF. In the present embodiment, a QFN type package is manufactured so that no cavity is formed inside the clamp face 52*a* of the lower mold 52. As a modification example, the invention can also be applied to a mode of the lower mold 52 having a cavity.

In the sealing step, a sealing resin is pressed into the cavity 51*b* to seal therewith the semiconductor chip 3, the wires 5, and a portion of each of the leads 4. Then, the resin supplied to the cavity 51*b* is set to form a device sealing portion (main body) 6*mb* of the sealing body 6 shown in FIG. 12.

As shown in FIG. 15, the molding die 50 has a cavity 51*b* that covers therewith the semiconductor chip 3 of the device forming portion LFd, a main runner 51*rm* that covers therewith the main-runner portion Lrm of the leadframe LF, and a subsidiary runner 51*rs* that covers therewith the sub-runner portion Lrs of the leadframe LF. As shown in FIGS. 7 and 15, a portion of the sub-runner portion Lrs and a portion of the device forming portion LFd each overlap with the gate portion Lg which is an opening portion formed in the leadframe LF. In the sealing step, the supply route of a resin to the cavity 51*b* can be formed by overlapping the main runner 51*rm* and the subsidiary runner 51*rs* of the molding die 50 with the frame portion LFs of the leadframe LF.

Described specifically, as shown in FIG. 16, two or more (two in FIG. 16) main runners 51*rm* extending in the direction Y are connected with a cull (a portion of the molding die 50 (refer to FIG. 15) configuring a cull sealing portion 6*c*1 shown in FIG. 16) 50*c*1 which is a resin supply portion. In this step, the resin arranged in the cull 50*c*1 is softened by heating and then, pressed using an unillustrated plunger. By this pressing, the resin is pushed out from the cull 50*c*1 to the main runner 51*rm*.

A plurality of subsidiary runners 51*rs* is connected with the main runner 51*rm*. The subsidiary runners 51*rs* are routes for supplying a resin to the device forming portions LFd and the same number of (five in FIG. 16) subsidiary runners 51*rs* as the device forming portions LFd arranged along the direction Y are connected with the main runner 51*rm*. In the sealing step, the resin pushed out from the main runner 51*rm* is branched and supplied into the subsidiary runners 51*rs*.

As shown in FIG. 15, a portion of the subsidiary runner 51*rs* overlaps with the gate portion Lg of the leadframe LF. As shown in FIG. 7, the gate portion Lg is a through-hole that links the sub-runner portion Lrs with the device forming portion LFd. Therefore, a passage having a height corresponding to the thickness of the leadframe LF is formed in the gate portion Lg by sandwiching, with the molding die 50, the upper surface LFa side and the lower surface LFb side of the gate portion Lg of the leadframe LF as shown in FIG. 15. In the sealing step, the resin supplied from the subsidiary runner 51*rs* is supplied in the cavity 51*b* through this passage formed in the gate portion Lg. A supply system of a resin having a supply port of the resin on the side of the side surface of the cavity 51 as shown in FIG. 15 is called “side gate system”. As described above, a supply system of a resin which defines the height of a channel of the resin in the gate portion Lg by the plate thickness (length from the upper surface LFa to the lower surface LFb or vice versa) of the leadframe LF is called “plate thickness gate system”.

In the example shown FIGS. 14 and 15, the leadframe LF and the lower mold 52 have therebetween a resin film (film material) 53. A pressing force from the clamp face 52*a* of the lower mold 52 is applied to the lower surface side (back surface side, mount surface side) of the leadframe LF via the resin film 53. As shown in FIG. 14, the lower surface 4*b* of the lead 4 and the lower surface 2*b* of the die pad 2 are therefore likely to firmly attach to the resin film 53. This firm attachment of the resin film 53 makes it possible to prevent the sealing resin from extending even to the lower surface 4*b* of the lead 4 and the lower surface 2*b* of the die pad 2. In short, the lower surface 4*b* of the lead 4 and the lower surface 2*b* of the die pad 2 can therefore be exposed.

The molding die 50 of the present embodiment employs a so-called piece sealing system. More specifically, the molding die is equipped with a plurality of cavities 51*b* and the sealing body 6 is formed using these cavities 51*b* arranged so as to correspond to the device forming portions LFd, respectively. In other words, in the sealing step in the present embodiment, the clamp face 51*a* of the upper mold 51 of the molding die 50 shown in FIG. 14 is pressed against each of the peripheries of the device forming portions LFd.

In this case, in addition to the device sealing portion 6*mb* formed in the cavity 51*b*, an in-dam resin portion 6*dm* buried in the dam portion Ldm (refer to FIG. 7) which is a space surrounded by the leads 4 adjacent to each other and the frame portion LFs is formed. An in-gate resin portion 6*g* is formed in the gate portion Lg which is a supply port of the resin. At a vent portion which is arranged diagonal to the gate portion and discharges a gas and an excess resin outside from the cavity 51*b* (refer to FIG. 14), an in-vent resin portion 6*vt* is formed. As described above, the cull 50*c*1, the main runner 51*rm*, and the subsidiary runner 51*rs* shown in FIG. 16 each configure a supply route of the resin so that in the present step, a cull sealing portion 6*c*1, a main runner sealing portion 6*rm*, and a sub-runner sealing portion 6*rs* are formed in the cull 50*c*1, the main runner 51*rm*, and the subsidiary runner 51*rs*, respectively.

The main runner 51*rm* and the subsidiary runner 51*rs* are routes for dividing and supplying a resin to the device forming portions LFd so that a large space volume is preferred in order not to impede the flow of the resin. From the standpoint of increasing the number of products available from one leadframe LF, the area of the frame portion LFs is preferably smaller. As shown in FIG. 15, therefore, the main runner 51*rm* and the subsidiary runner 51*rs* have a height (difference in height relative to the clamp face 51*a* used as a standard surface) greater than that of the cavity 51*b*. As a result, the thickness of the main-runner sealing portion 6*rm* and the sub-runner sealing portion 6*rs* formed in this step is greater than that of the device sealing portion 6*mb*. In recent years, the thickness of the device sealing portion 6*mb* has tended to be smaller in order to satisfy the demand for thinning a semiconductor package. In the example shown in FIG. 15, the thickness of the main-runner sealing portion 6*rm* and the sub-runner sealing portion 6*rs* is twice or more greater than that of the device sealing portion 6*mb*

In the present embodiment, a spacer resin portion 6*sp* is formed between two device forming portions LFd adjacent to each other. In the steps shown in FIG. 5 after the sealing step, this spacer resin portion 6*sp* functions as a support member when two or more leadframes LF are stacked one after another. In the present embodiment, as shown in FIG. 16, two device forming portions LFd adjacent to each other have therebetween the main-runner sealing portion 6*rm* and the sub-runner sealing portion 6*rs* so that it seems possible to use them as a spacer member. As described above, however, the thickness of the main-runner sealing portion 6*rm* and the sub-runner sealing portion 6*rs* are twice or more greater than that of the device sealing portion 6*mb* so that using them as a spacer member reduces a volumetric efficiency when two or more leadframes LF are stacked one after another.

In the present embodiment, a plurality of spacer resin portions 6*sp* is formed which has a shape suited for use when two or more leadframes LF are stacked one after another. For example, the thickness of the spacer resin portion 6*sp* shown in FIG. 12 is greater than the thickness of the device sealing portion 6*mb* and at the same time, is not greater than twice the thickness of the device sealing portion 6*mb*. In the gate breaking step shown in FIG. 5, the main-runner sealing portion 6*rm* and the sub-runner sealing portion 6*rs* are separated from the leadframe LF and then removed.

In the example shown in FIG. 12, the spacer resin portion 6*sp* and the in-vent resin portion 6*vt* are connected with each other. This means that in the sealing step in the present embodiment, two device forming portions LFd adjacent to each other have therebetween a flow cavity (not illustrated) different from the cavity 51*b* shown in FIG. 14. This flow cavity and the cavity 51*b* are connected via a vent portion. The resin placed in the cavity 51*b* is supplied into the flow cavity via the vent portion. The resin then conforms to the shape of the flow cavity and is molded into a spacer resin portion 6*sp* as shown in FIG. 12.

In the present embodiment, as shown in FIG. 12, the device sealing portion 6*mb*, the main-runner sealing portion 6*rm*, and the sub-runner sealing portion 6*rs* are formed on the side of the upper surface LFa of the leadframe LF. On the other hand, the leadframe LF has, on the side of the lower surface LFb thereof, no protrusion from the lower surface LFb as shown in FIG. 17. A volumetric efficiency can therefore be improved when two or more leadframes LF are stacked one after another.

Figure 18:
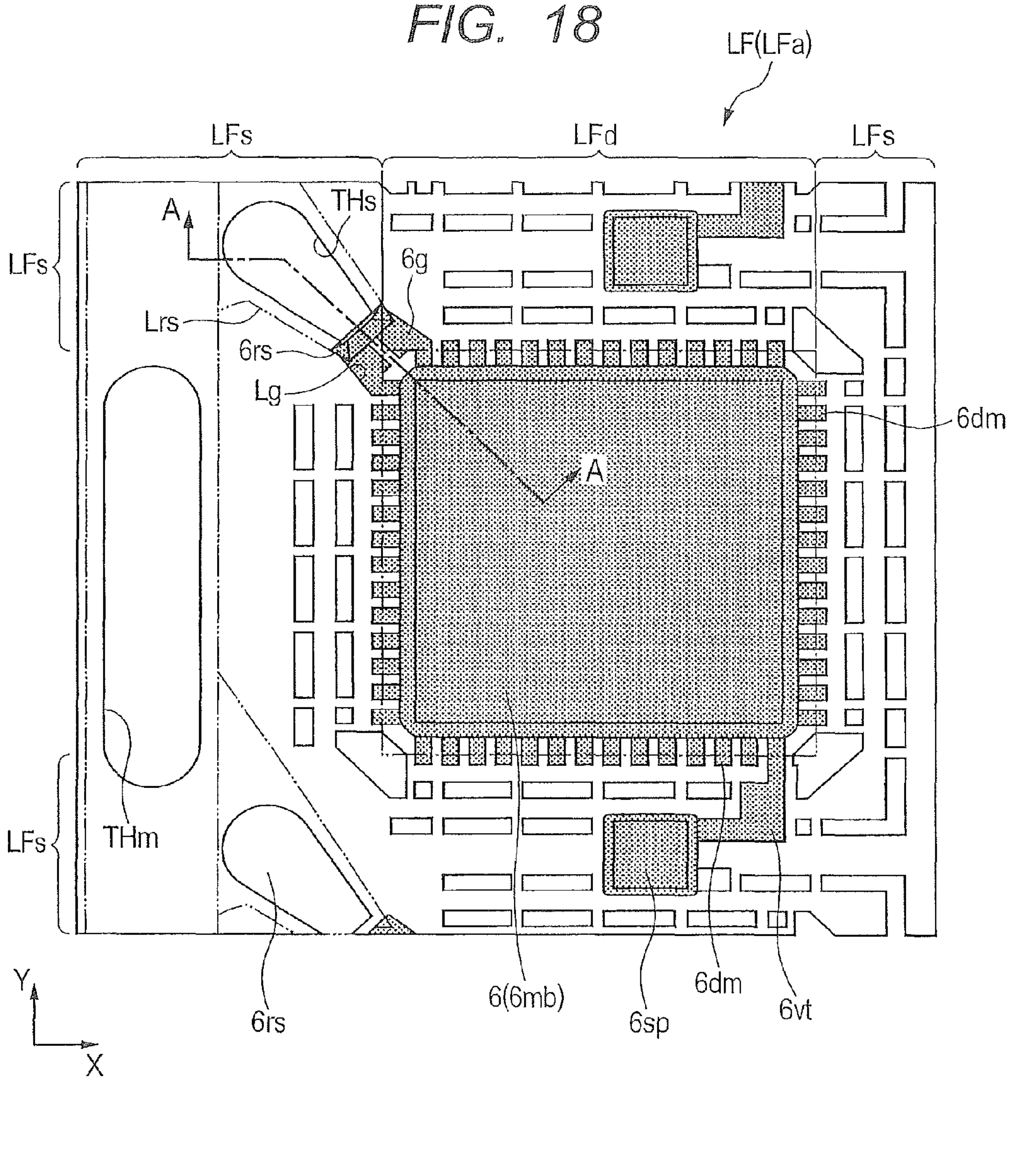
FIG. 18 is an enlarged plan view after removal of the main-runner sealing portion and the sub-runner sealing portion shown in FIG. 12.
Figure 19:
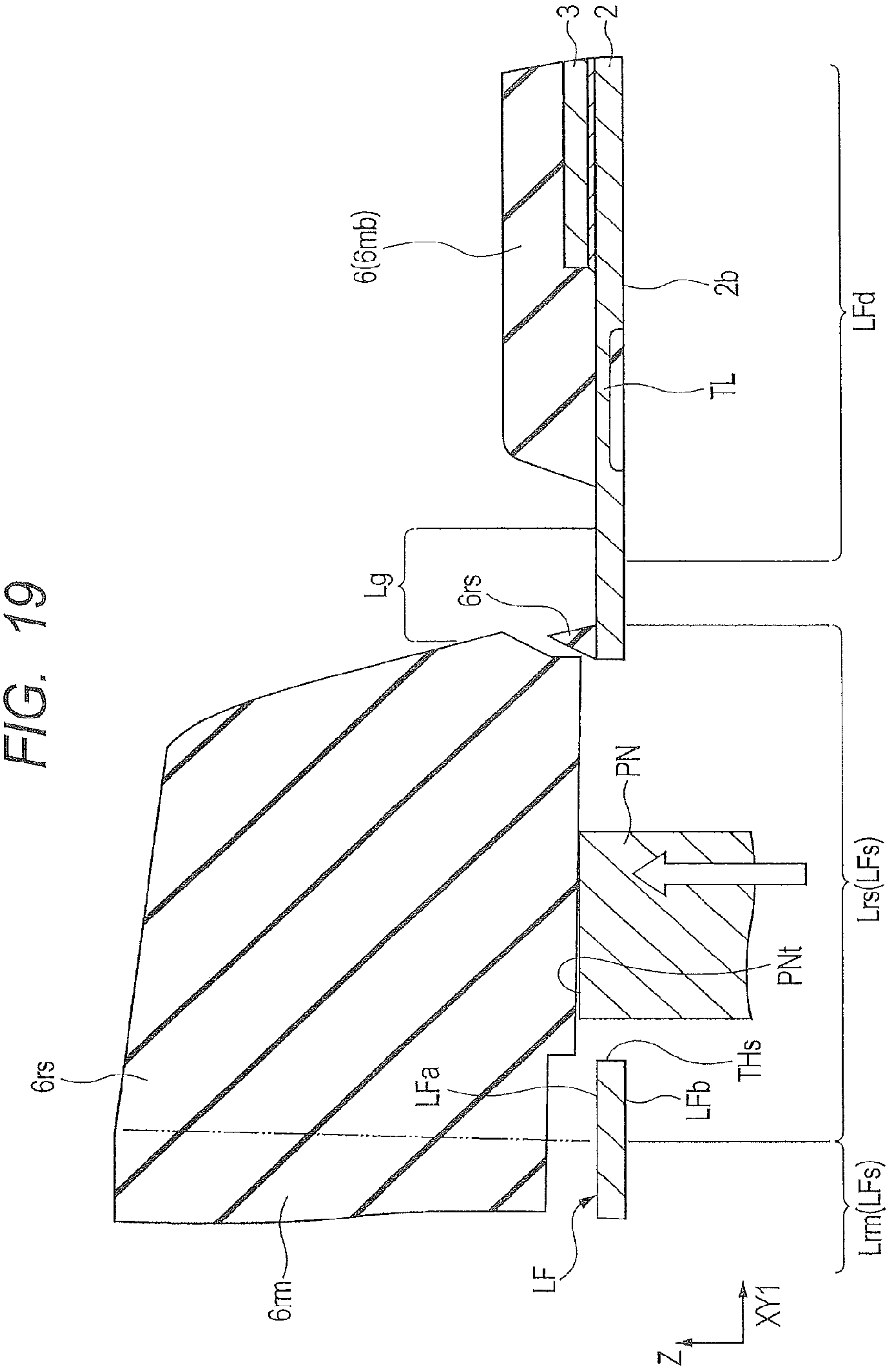
FIG. 19 is an enlarged cross-sectional view taken along the line A-A shown in FIG. 18 and showing the main-runner sealing portion and the sub-runner sealing portion pushed out by a pin inserted from the lower surface side of the leadframe.
Figure 20:
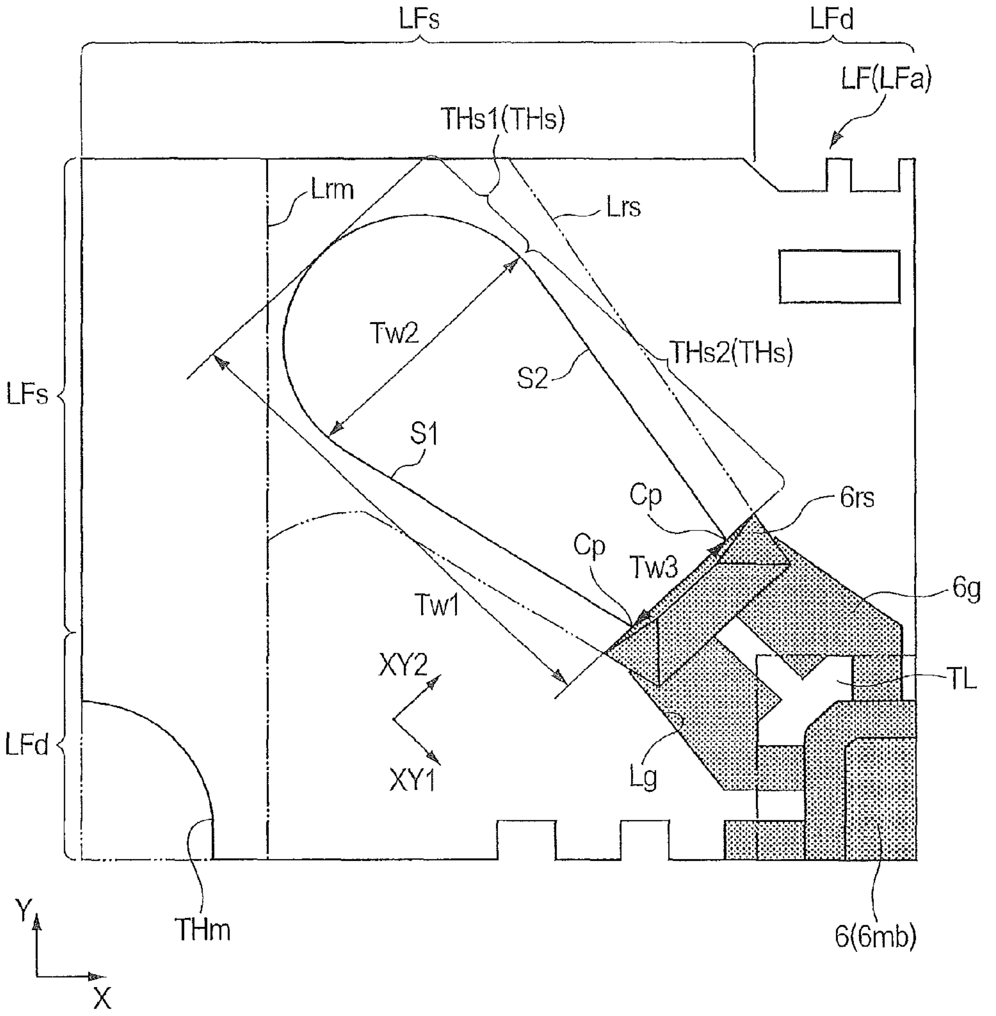
FIG. 20 is an enlarged plan view at the periphery of the sub-runner portion shown in FIG. 18.
Figure 24:
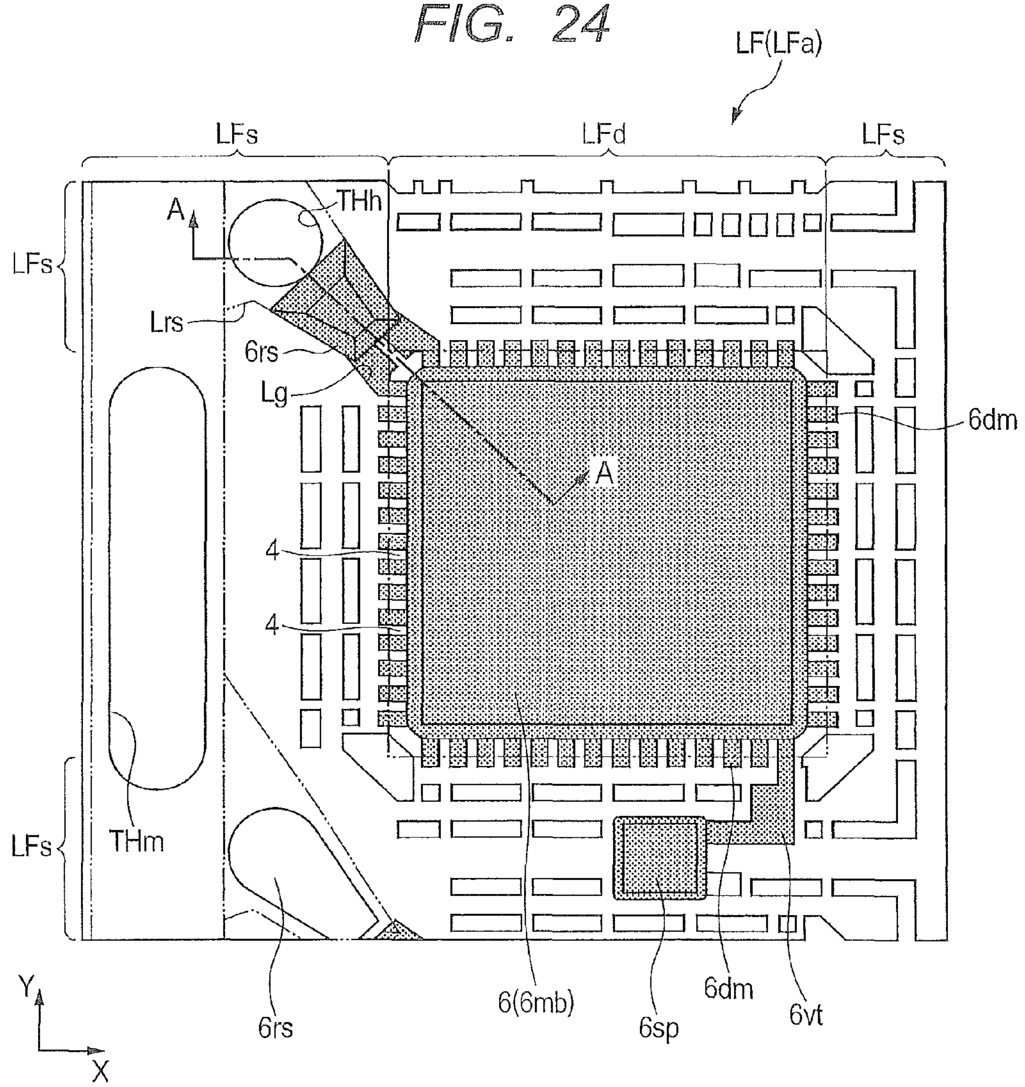
FIG. 24 is an enlarged plan view showing a comparative example with FIG. 18.
Figure 25:
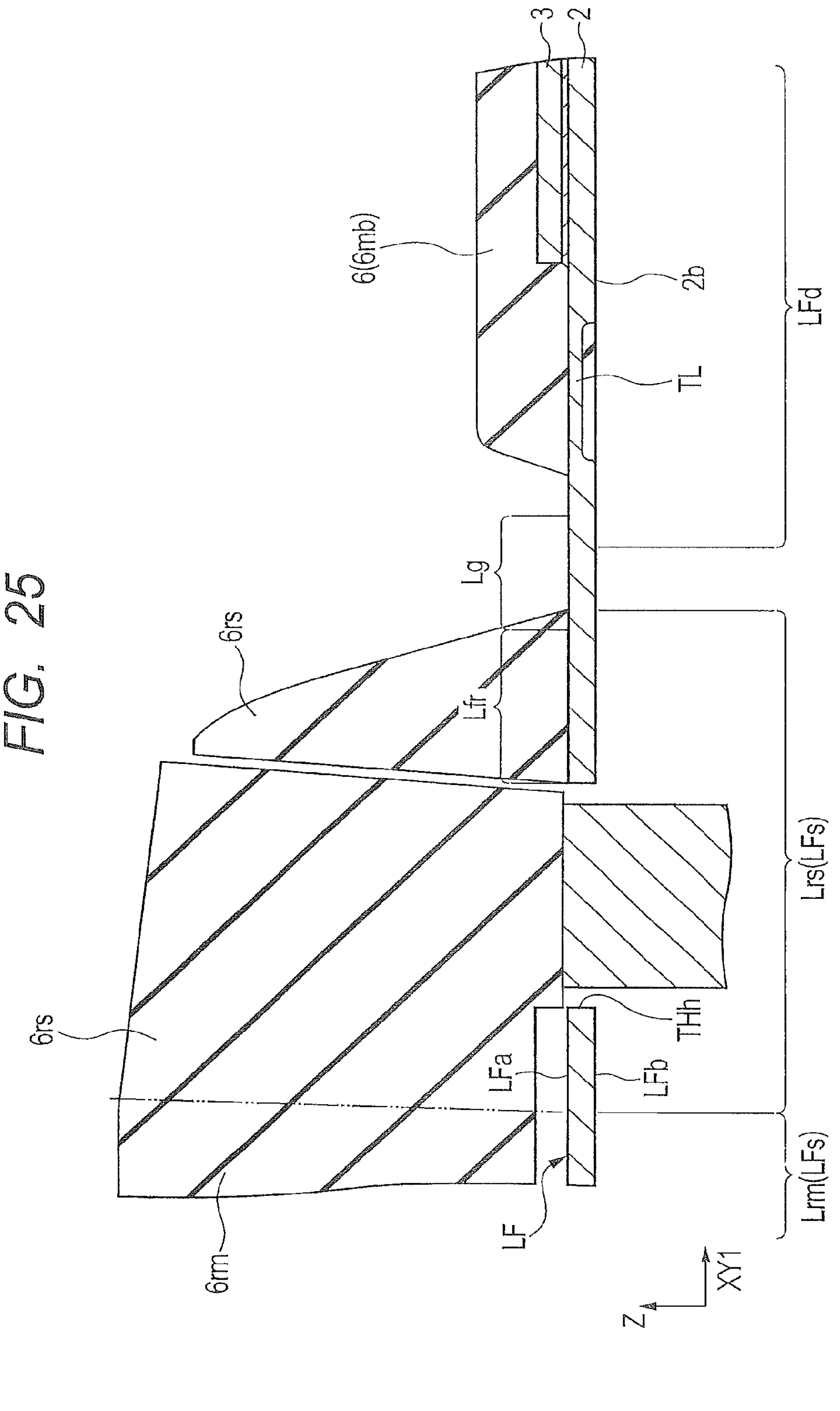
FIG. 25 is an enlarged cross-sectional view taken along the line A-A shown in FIG. 24 and showing the main-runner sealing portion and the sub-runner sealing portion pushed out by a pin inserted from the lower surface side of the leadframe.

5. Gate Breaking Step (Step of Removing a Main-Runner Sealing Portion and a Sub-Runner Sealing Portion):

Next, as the gate breaking step shown in FIG. 5, the main-runner sealing portion 6*rm* and the sub-runner sealing portion 6*rs* shown in FIG. 17 are separated from the leadframe LF. FIG. 18 is an enlarged plan view after removal of the main-runner sealing portion and the sub-runner sealing portion shown FIG. 12. FIG. 19 is an enlarged cross-sectional view taken along the line A-A shown in FIG. 18 and showing the main-runner sealing portion and the sub-runner sealing portion pushed out by a pin inserted from the lower surface side of the leadframe. FIG. 20 is an enlarged plan view at the periphery of the sub-runner portion shown in FIG. 18. FIG. 24 is an enlarged plan view showing a comparative example with FIG. 18. FIG. 25 is an enlarged cross-sectional view taken along the line A-A shown in FIG. 24 and showing the main-runner sealing portion and the sub-runner sealing portion pushed out by a pin inserted from the lower surface side of the leadframe.

In the steps shown in FIG. 5 after the sealing step, it is preferred to remove the main-runner sealing portion 6*rm* and the sub-runner sealing portion 6*rs* shown in FIG. 12 from the standpoint of improving a manufacturing efficiency. For example, remaining of the main-runner sealing portion 6*rm* and the sub-runner sealing portion 6*rs* on the side of the upper surface LFa of the leadframe LF reduces the volumetric efficiency when two or more leadframes LF are stacked one after another. In addition, remaining of the main-runner sealing portion 6*rm* and the sub-runner sealing portion 6*rs* on the side of the upper surface LFa of the leadframe LF may limit work in each step.

In the present embodiment, therefore, the sealing step is followed by a gate breaking step and in this step, the main-runner sealing portion 6*rm* and the sub-runner sealing portion 6*rs* are separated from the leadframe LF.

As a method of removing the main-runner sealing portion 6*rm* and the sub-runner sealing portion 6*rs*, the main-runner sealing portion 6*rm* to be connected with the cull sealing portion 6*cl* and the sub-runner sealing portion 6*rs* connected with the main-runner sealing portion 6*rm* may be peeled from the leadframe LF while using the cull sealing portion 6*cl* shown in FIG. 16 as a fulcrum. The main-runner sealing portion 6*rm* and the sub-runner sealing portion 6*rs* however attach firmly to the leadframe LF so that stress concentration occurs on a portion of the main-runner sealing portion 6*rm* or the sub-runner sealing portion 6*rs* and breakage may occur at an unintended position.

In the present embodiment, as described referring to FIG. 7, the main-runner portion Lrm and the sub-runner portion Lrs of the leadframe have a main-through-hole THm and a sub-through-hole THs, respectively. The main-through-hole THm and the sub-through-hole THs are through-holes provided for removing the main-runner sealing portion 6*rm* and the sub-runner sealing portion 6*rs* and they are formed so as to penetrate from one of the upper surface LFa and the lower surface LFb (refer to FIG. 17) of the leadframe to the other.

In this step, a pin (degate pin) PN shown in FIG. 19 is inserted into each of the main-through-hole THm and the sub-through-hole THs from the lower surface LFb side of the leadframe LF shown in FIG. 17 to separate the main-runner sealing portion 6*rm* and the sub-runner sealing portion 6*rs* from the leadframe LF. The pin PN is a columnar or prismatic rod-like member and by pressing the end surface (pushing surface) PNt of the pin against the resin body (the main-runner sealing portion 6*rm* or the sub-runner sealing portion 6*rs*), a pushing force for peeling the resin body from the leadframe LF is added. The end surface PNt of the pin PIN has a circular or rectangular planar shape.

FIG. 19 shows a typical state of the pin PN inserted into the sub-through-hole THs. The pin PN is inserted similarly into the main-through-hole THm shown in FIG. 17. In this step, when the pin PN shown in FIG. 19 is inserted into each of the main-through-hole THm and the sub-through-hole THs from the lower surface LFb side of the leadframe LF shown in FIG. 17, a pushing force from the pin PN is applied to the vicinity of the firmly attached surface between the leadframe LF and each of the main-runner sealing portion 6*rm* and the sub-runner sealing portion 6*rs*. This makes it possible to suppress stress concentration on a portion of the main-runner sealing portion 6*rm* or the sub-runner sealing portion 6*rs*.

With regards to the order of inserting the pin PN (refer to FIG. 19) into the main-through-hole THm and the sub-through-hole THs shown in FIG. 17, for example, it can be inserted simultaneously in the main-through-hole THm and the sub-through-hole THs. In consideration of peeling ease from the leadframe LF, however, it is preferred to peel a member having a larger adhesion area with the leadframe LF first. It is therefore preferred to insert the pin PN into the main-through-hole THm first to peel the main-runner sealing portion 6*rm* from the leadframe LF and then, insert the pin PN into the sub-through-hole THs to peel the sub-runner sealing portion 6*rs* from the leadframe LF.

When two or more sub-runner sealing portions 6*rs* are connected with one main-runner sealing portion 6*rm* as shown in FIG. 16, these sub-runner sealing portions 6*rs* are preferably peeled one by one from the leadframe LF rather than simultaneous peeling. In the present embodiment, the pin PIN (refer to FIG. 19) is inserted into the sub-runner sealing portions 6*rs* in order from that at a position closest to the cull sealing portion 6*c*1 and they are peeled from the leadframe LF. In other words, the pin PN is inserted into the sub-through-hole THs arranged relatively close to the cull sealing portion 6$c$1 to peel the sub-runner sealing portion 6$rs$ from the leadframe LF and then the pin PN is inserted into the sub-through-hole THs arranged relatively distant from the cull sealing portion 6$c$1 to peel the sub-runner sealing portion 6$rs$ from the leadframe LF.

As a result of further investigation on the technology of inserting the pin PN shown in FIG. 19 into each of the main-through-hole THm and the sub-through-hole THs from the lower surface LF side of the leadframe LF in the gate breaking step, the present inventors have found the following problem. Described specifically, they have found that the sub-runner sealing portion 6$rs$ breaks at an intermediate portion thereof and a portion of the sub-runner sealing portion 6$rs$ thicker (higher) than the spacer resin portion 6$sp$ shown in FIG. 12 remains, depending on the shape of the sub-through-hole THs.

Described specifically, the present inventors investigated a comparative example in which a sub-through-hole THh having a circular planar shape is formed in the vicinity of a branch point between the main-runner portion Lrm and the sub-runner portion Lrs of the leadframe LF as shown in FIG. 24. The comparative example shown in FIG. 24 is different from the present embodiment shown in FIG. 18 in an opening shape of the sub-through-hole THh. Except for this difference, the comparative example is similar to the present embodiment so that overlapping descriptions are omitted.

In the comparative example shown in FIG. 24, the sub-through-hole THh has a circular opening shape in plan view. The pin PN shown in FIG. 19 has a columnar or prismatic shape so that from the standpoint of forming a through-hole permitting insertion of the pin PN, the circular sub-through-hole THh shown in FIG. 25 does not pose any problem. A portion of the sub-runner sealing portion 6$rs$ shown in FIG. 12 where stress concentration occurs most in the gate breaking step is the vicinity of the boundary between the main-runner sealing portion 6$rm$ and the sub-runner sealing portion 6$rs$. As shown in FIG. 24, therefore, by arranging the sub-through-hole THh in the vicinity of the branch point between the main-runner portion Lrm and the sub-runner portion Lrs of the leadframe LF, breakage of the sub-runner sealing portion 6$rs$ in the vicinity of the boundary between the main-runner sealing portion 6$rm$ and the sub-runner sealing portion 6$rs$ can be prevented or suppressed.

The shape of the sub-runner sealing portion 6$rs$ extends from the boundary with the main-runner sealing portion 6$rm$ to the gate portion Lg. When the sub-through-hole THh is arranged in the vicinity of the branch point between the main-runner portion Lrm and the sub-runner portion Lrs in the leadframe LF, therefore, a region having no opening portion therein, that is, a region Lfr where the sub-runner sealing portion 6$rs$ firmly attaches to the frame portion LFs of the leadframe LF as shown in FIG. 25 widens between the sub-through-hole THh and the gate portion Lg. In other words, arrangement of the circular sub-through-hole THh in the vicinity of the branch point between the main-runner portion Lrm and the sub-runner portion Lrs of the leadframe LF increases an adhesion area between the sub-runner sealing portion 6$rs$ and the leadframe LF.

As described above, an increase in the adhesion area between the sub-runner sealing portion 6$rs$ and the leadframe LF makes it difficult to peel the sub-runner sealing portion 6$rs$ from the leadframe LF in the gate breaking step. Application of a greater external force is necessary for peeling the sub-runner sealing portion 6$rs$ from the leadframe LF so that a stress that occurs in the sub-runner sealing portion 6$rs$ becomes large. Stress concentration is likely to occur on the boundary between the sub-runner sealing portion 6$rs$ and the sub-through-hole THh so that the sub-runner sealing portion 6$rs$ is easily broken due to cracks formed with the boundary between the region Lfr and the sub-through-hole THh shown in FIG. 25 as an origin. As shown in FIG. 25, a portion of the sub-runner sealing portion 6$rs$ therefore remains on the side of the upper surface LFa of the leadframe LF and the thickness of the remaining portion becomes greater than that of the device sealing portion 6$mb$ of the sealing body 6.

In recent years, in order to reduce a halogen content in a resin, a bromine (Br)-based flame retardant is sometimes not incorporated in the sealing body 6. When the sealing body 6 does not contain a bromine (Br)-based flame retardant, the sealing body 6 has improved adhesion with the leadframe LF. Improved adhesion between the sealing body 6 and the leadframe LF is preferable from the standpoint of providing a semiconductor device having improved reliability in the interface between the device sealing portion 6$mb$ and the leadframe LF. At the interface between the sub-runner sealing portion 6$rs$ and the leadframe LF, however, the sub-runner sealing portion 6$rs$ cannot be removed easily and moreover, this sub-runner sealing portion 6$rs$ is likely to break in the gate breaking step.

From the standpoint of suppressing breakage of the sub-runner sealing portion 6$rs$, it is preferred to shorten the extending distance of the sub-runner sealing portion 6$rs$, in other words, decrease the distance between the gate portion Lg and the main-runner sealing portion 6$rm$. In the sealing step, however, a clamp region with which the clamp face 51$a$ of the die 51 is brought into contact should be formed in the leadframe LF (at the periphery of the device forming portion LFd). This results in an increase, corresponding to the width of the clamp region, in the distance between the gate portion Lg and the main-runner sealing portion 6$rm$.

The present inventors have found the configuration of the present embodiment based on the above-mentioned investigation results. In the present embodiment, as shown in FIG. 18, an adhesion area between the sub-runner sealing portion 6$rs$ and the upper surface LFa of the leadframe LF can be reduced by increasing the opening area of the sub-through-hole THs formed at the position where the sub-runner sealing portion 6$rs$ is formed. Such a configuration facilitates peeling of the sub-runner sealing portion 6$rs$ from the leadframe LF.

Described specifically, as shown in FIG. 20, the sub-through-hole THs formed in the leadframe LF of the present embodiment has, along the extending direction (direction XY1 in FIG. 20) of the sub-runner portion Lrs, a portion THs1 located on the side of the main-runner portion Lrm and a portion THs2 located on the side of the gate portion Lg relative to the portion THs1. In the example shown in FIG. 20, the sub-through-hole THs has a shape in which a diameter portion of the portion THs1 having a semicircular opening shape and a bottom side (lower bottom) portion of the portion THs2 having a trapezoidal opening shape have been linked (shared) in plan view. As shown in FIG. 20, this means that, in the sub-through-hole THs, the maximum opening width Tw2 of the portion THs1 of the sub-through-hole THs in a direction XY2 perpendicular to the extending direction XY1 of the sub-runner portion Lrs is greater than the opening width Tw3, in the direction XY2, at the end portion of the portion THs2 of the sub-through-hole THs on the side of the gate portion Lg. In other words, in plan view, the opening width of the sub-through-hole THs in the direction XY2 perpendicular to the extending direction XY1 of the sub-runner portion Lrs gradually decreases from the boundary portion (the diameter portion of the semicircle, the bottom side portion of the trapezoid) between the portion THs1 and the portion THs2 to the end portion of the portion THs2 on the side of the gate portion Lg.

In a plan view, the maximum opening width TW1 of the sub-through-hole THs in the direction XY1 is greater than the maximum opening width Tw2 of the sub-through-hole in the direction XY2 perpendicular to the direction XY1. This means that in the present embodiment, the sub-through-hole THs is formed so as to extend along the direction XY1 which is an extending direction of the sub-runner portion Lrs. This makes it possible to reduce the adhesion area between the sub-runner sealing portion 6*rs* and the leadframe LF in the direction XY1 shown in FIG. 20.

As described above, the volume of the main runner 51*rm* and the subsidiary runner 51*rs* of the molding die 50 shown in FIG. 15 is preferably made greater from the standpoint of facilitating the flow of the resin. On the other hand, from the standpoint of control ease of the flow direction of the resin, the cross-sectional area of the flow channel of the resin becomes smaller in the gate portion Lg which is a supply port of the resin to the cavity 51*b*. As shown in FIG. 20, the width of the sub-runner portion Lrs covered with the subsidiary runner 51*rs* (refer to FIG. 15) gradually decreases from the main-runner portion Lrm to the gate portion Lg in plan view.

As in the present embodiment, when the opening width of the sub-through-hole THs in the direction XY2 gradually decreases from the portion THs1 to the end portion of the portion THs2 on the side of the gate portion Lg, the sub-through-hole THs does not protrude from the sub-runner portion Lrs and at the same time, an adhesion area between the sub-runner sealing portion 6*rs* and the leadframe LF in the direction XY2 can be reduced.

In the present embodiment, an adhesion area with the upper surface LFa of the leadframe LF can be reduced by increasing the opening area of the sub-through-hole THs without causing it to protrude from the sub-runner portion Lrs. This leads to improvement in peeling ease of the sub-runner sealing portion 6*rs* from the leadframe LF.

In the present embodiment, as shown in FIG. 19, the sub-through-hole THs extends to the vicinity of the gate portion Lg. This makes it easier to peel the sub-runner sealing portion 6*rs* from the leadframe LF in the gate breaking step than peeling in the comparative example described referring to FIG. 25. In the gate breaking step of the present embodiment, therefore, the sub-runner sealing portion 6*rs* does not break easily. Even if the sub-runner sealing portion 6*rs* breaks, stress concentration that causes breakage occurs at the end portion of the sub-through-hole THs on the side of the gate portion Lg. Even if a portion of the sub-runner sealing portion 6*rs* remains on the side of the upper surface LFa of the leadframe LF as shown in FIG. 19, the thickness of the remaining portion is smaller than that of the device sealing portion 6*mb* of the sealing body 6.

Thus, in the present embodiment, it is possible to suppress remaining of a portion of the sub-runner sealing portion 6*rs* thicker than the device sealing portion 6*mb* of the sealing body 6 on the side of the upper surface LFa of the leadframe LF. As a result, when the leadframes LF are stacked one after another, the distance between the thus-stacked leadframes LF can be controlled by the thickness of the spacer resin portion 6*sp* shown in FIG. 18, leading to improvement in volumetric efficiency of the leadframes LF thus stacked.

As described above, even if a portion of the sub-runner sealing portion 6*rs* remains on the side of the upper surface LFa of the leadframe LF, the thickness of the remaining portion becomes smaller than that of the device sealing portion 6*mb* of the sealing body 6. This means that the thickness of the remaining portion is smaller than that of the spacer resin portion 6*sp* shown in FIG. 18. Two or more leadframes LF can therefore be stacked one after another stably by bringing the spacer resin portion 6*sp* on the lower stage side into contact with the lower surface LFb (refer to FIG. 17) of the leadframe LF on the upper stage side.

As described above, in the present embodiment, the opening shape of the sub-through-hole THs formed in the sub-runner portion Lrs of the leadframe LF is determined so as to make the opening area greater without causing protrusion of the sub-through-hole THs from the sub-runner portion Lrs. In addition, the sub-through-hole Ths has preferably the following shape from the standpoint of suppressing stress concentration which will be a cause of the breakage of the sub-runner sealing portion 6*rs* shown in FIG. 19.

Described specifically, as shown in FIG. 20, the peripheral portion (end portion) of the portion THs1 of the sub-through-hole THs on the side of the main-runner portion Lrm is preferably curved so as to get close to the main-runner portion Lrm (so as to be distant from the gate portion Lg). In other words, the portion THs1 of the sub-through-hole THs has preferably no folding points. In the example shown in FIG. 20, the peripheral portion (end portion) of the portion THs1 of the sub-through-hole THs on the side of the main-runner portion Lrm has an arc-like shape. When the sub-through-hole THs has, at the peripheral portion thereof, a folding point (particularly, a sharp folding point whose inner angle is 90° or less), stress concentration easily occurs at the adhesion interface between the sub-runner sealing portion 6*rs* and the leadframe LF at the folding point. When the portion THs1 arranged on the side of the main-runner portion Lrm has a folding point, the sub-runner sealing portion 6*rs* may break in the vicinity of the folding point in the gate breaking step. As shown in FIG. 20, however, when the portion THs1 of the sub-through-hole THs has, at the peripheral portion on the side of the main-runner portion Lrm, is curved so as to get close to the main-runner portion Lrm, stress concentration does not easily occur so that the breakage of the sub-runner sealing portion 6*rs* can be suppressed.

As shown in FIG. 15, in the sealing step, when the resin film 53 is interposed between the leadframe LF and the lower mold 52, a folding point at the peripheral portion of the sub-through-hole THs facilitates formation of a wrinkle in the resin film 53. A wrinkle mark remains on the resin body (that is, the sub-runner sealing portion 6*rs*) after molding when the resin is set without removing the wrinkle. Thus, when the sub-runner sealing portion 6*rs* has a wrinkle mark, stress concentration to the wrinkle mark portion easily occurs in the gate breaking step. The wrinkle mark is likely to be an origin of the breakage of the sub-runner sealing portion 6*rs*. When the resin film 53 is interposed between the leadframe LF and the lower mold 52 in the sealing step as shown in FIG. 15, therefore, particularly the portion THs1 of the sub-through-hole THs has preferably no folding point.

The portion THs2 of the sub-through-hole THs on the side of the gate portion Lg may have a linear end portion as shown in FIG. 20. The distance between the gate portion Lg and the sub-through-hole THs can be decreased as shown in FIG. 7 by straightening the end portion of the portion THs2 of the sub-through-hole THs on the side of the gate portion Lg. By straightening the end portion of the portion THs2 of the sub-through-hole THs on the side of the gate portion Lg, the straightened portion has, at both ends thereof, a folding point Cp. Since the distance between the position of the folding point Cp and the gate portion Lg is short, even if the sub-runner sealing portion 6*rs* breaks with the folding point Cp as an origin, a slight portion of it on the side of the gate portion Lg remains on the leadframe LF as shown in FIG. 20. The thickness of the remaining portion therefore becomes smaller than that of the device sealing portion 6*mb* of the sealing body 6 as shown in FIG. 19. Thus, by intentionally causing stress concentration at the end portion of the portion THs2 of the sub-through-hole THs on the side of the gate portion Lg, stress concentration at another portion of the sub-runner sealing portion 6*rs* can be suppressed. From the standpoint of stably decreasing the thickness of the remaining portion of the sub-runner sealing portion 6*rs*, the straightened end portion of the portion THs2 of the sub-through-hole THs on the side of the gate portion Lg is preferred.

As shown in FIG. 7, the opening of the main-through-hole THm is elliptical in plan view and it has no folding point. The main-runner sealing portion 6*rm* shown in FIG. 12 has a fracture-resistant structure.

From the standpoint of increasing the opening area of the portion THs2, a side S1 and a side S2 of the portion THs2 extending along the direction XY1 are preferably arranged substantially parallel to the boundary line of the sub-runner portion Lrs. The side S1 and the side S2 arranged in parallel to the boundary line of the sub-runner portion Lrs enables maximization of the opening area of the portion THs2 so that the adhesion area between the sub-runner sealing portion 6*rs* and the leadframe LF can be reduced further.

In the present embodiment, the opening shape of the sub-through-hole THs extends along the direction XY1 so that for example when a columnar or prismatic pin PN (refer to FIG. 19) is used, the pin PN can be inserted into any selected position of the sub-through-hole THs. According to the investigation by the present inventors, in the embodiment shown in FIG. 20, most of the sub-runner sealing portion 6*rs* can be removed stably wherever the pin PN is inserted. From the standpoint of preventing the pin PN from making contact with the peripheral portion of the sub-through-hole THs, the inserting position of the pin PN includes at least the portion THs1.

6. Baking Step

Figure 21:
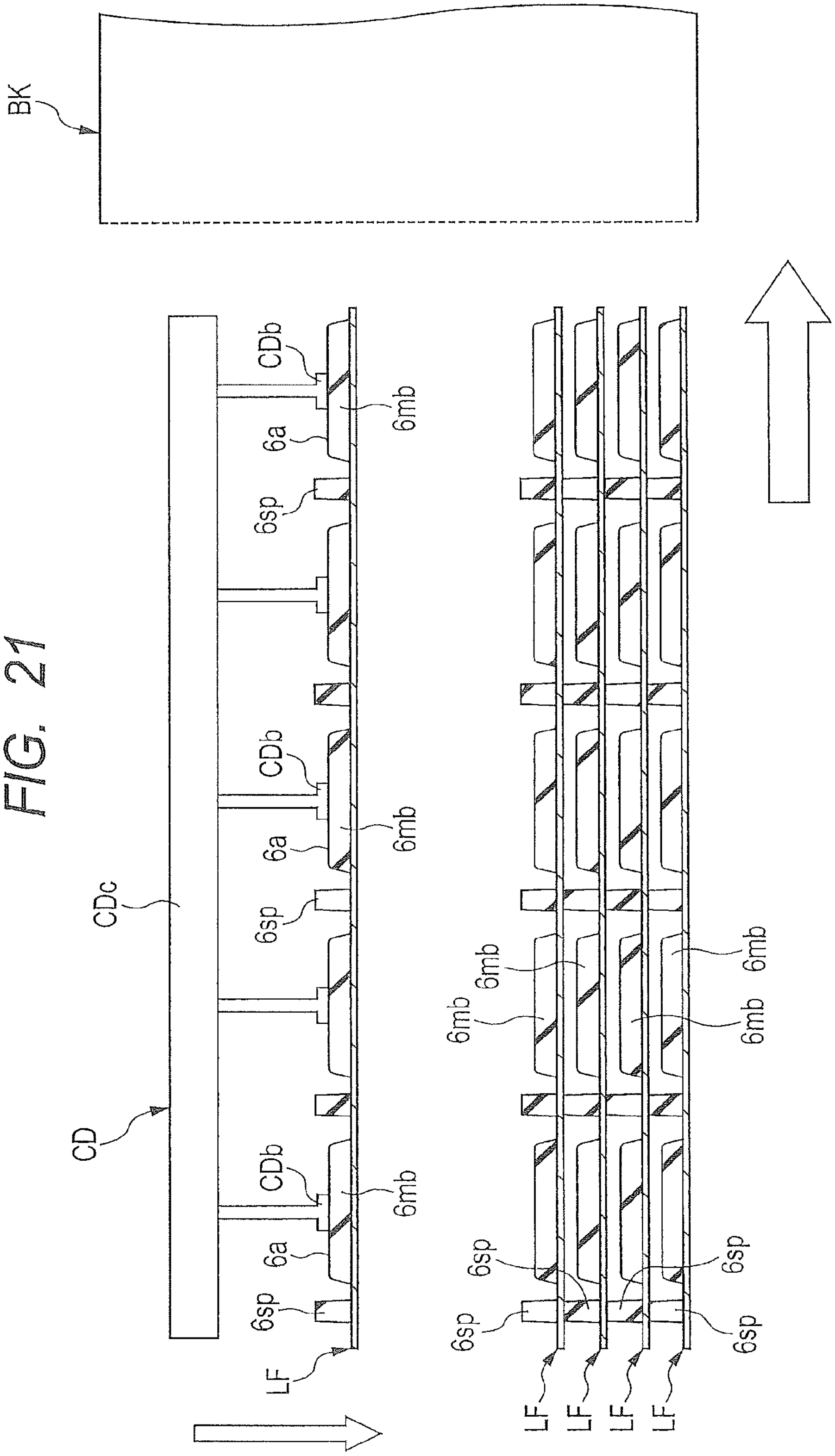
FIG. 21 is an explanatory view schematically showing a stack of the leadframes of FIG. 18 to be carried in a baking furnace.

Next, as the baking step shown in FIG. 5, the leadframe LF taken out from the molding die is transferred to a baking furnace BK, where the leadframe LF is heat treated. FIG. 21 is an explanatory view schematically showing a stack of the leadframes of FIG. 18 to be carried in a baking furnace. The resin supplied in the cavity in the above-mentioned sealing step has been set but is not completely set yet, because a leadframe LF to be put in the molding die 50 (refer to FIG. 14) next can be subjected to a molding step as soon as possible. In the present embodiment, the resin setting step is conducted in twice. In the present baking step, an effective component contained in the sealing body 6 formed in the sealing step is completely set (subjected to main setting).

In this step, carry-in treatment into the baking furnace BK and thermosetting treatment in the baking furnace BK are conducted while stacking a plurality of leadframes LF as shown in FIG. 21. In other words, in the present embodiment, as shown in FIG. 5, after the gate breaking step but prior to the baking step, a frame stacking step of stacking the leadframes LF is conducted. The leadframes LF have, as described above, spacer resin portions 6*sp*. The thickness (height) of the spacer resin portion 6*sp* is greater than the thickness (height) of the device sealing portion 6*mb*. This makes it possible to prevent or suppress the damage of the device sealing portion 6*mb* even if the leadframes LF are stacked. In addition, stacking of the leadframes LF can save a space therefor so that the number of the leadframes LF to be treated simultaneously increases. This leads to improvement in energy efficiency in the baking step.

In the present embodiment, as shown in FIG. 5, the gate breaking step is followed by the baking step. When the baking step is conducted while leaving the main-runner sealing portion 6*rm* and the sub-runner sealing portion 6*rs* shown in FIG. 16, thermal expansion of the main-runner sealing portion 6*rm* and the sub-runner sealing portion 6*rs* adversely affect to cause warpage of the leadframes LF. In this embodiment, therefore, the baking step is followed by the gate breaking step to suppress warpage deformation of the leadframes LF.

The step of stacking the leadframes LF is conducted, for example, by using a carrier device CD shown in FIG. 21. The carrier device CD has a plurality of adsorption retention portions CDb and a carrying mechanism portion CDc connected with the adsorption retention portions. In the example shown in FIG. 21, the leadframes LF are adsorbed and retained by bringing each of the adsorption retention portions CDb into contact with the upper surface 6*a* of each of the device sealing portions 6*mb*. The carrying mechanism portion CDc is operated while adsorbing and retaining the leadframes LF and the leadframes LF are stacked one after another.

In the present embodiment, as one mode of a method of carrying the leadframes LF in a stacked form or a method of processing them in a stacked form, an application example of it to the baking step has been described. Carrying of the leadframes LF in a stacked form as shown in FIG. 21 is applied not only to the present step but also to each of the steps until a singulation step.

In conducting each step after the baking step shown in FIG. 5, the leadframes LF should be taken out individually from the stack of the leadframes LF. In other words, as shown in FIG. 5, after the baking step but prior to the resin removal step, a frame stack releasing step, that is, a step of individually and sequentially taking out the leadframes LF from the stack of the leadframes LF by using a holding jig is conducted in the present embodiment. As the holding jig, usable is, for example, the carrier device CD that adsorbs and retains the leadframes LF by bringing each of the adsorption retention portions CDb into contact with the upper surface 6*a* of the device sealing portions 6*mb* as shown in FIG. 21.

In the above gate breaking step, when the sub-runner sealing portion 6*rs* (refer to FIG. 25) thicker than the spacer resin portion 6*sp* remains, the leadframe LF inclines in the frame stacking step so that it cannot always be adsorbed and retained properly at the time of pick up in the frame stack releasing step. According to the present embodiment, however, even if a portion of the sub-runner sealing portion 6*rs* remains on the side of the upper surface LFa of the leadframe LF as described above, the thickness of the remaining portion becomes smaller than that of the device sealing portion 6*mb* of the sealing body 6. The leadframe LF can therefore easily be adsorbed and retained by using, for example, the carrier device CD shown in FIG. 21 as a holding jig.

Figure 22:
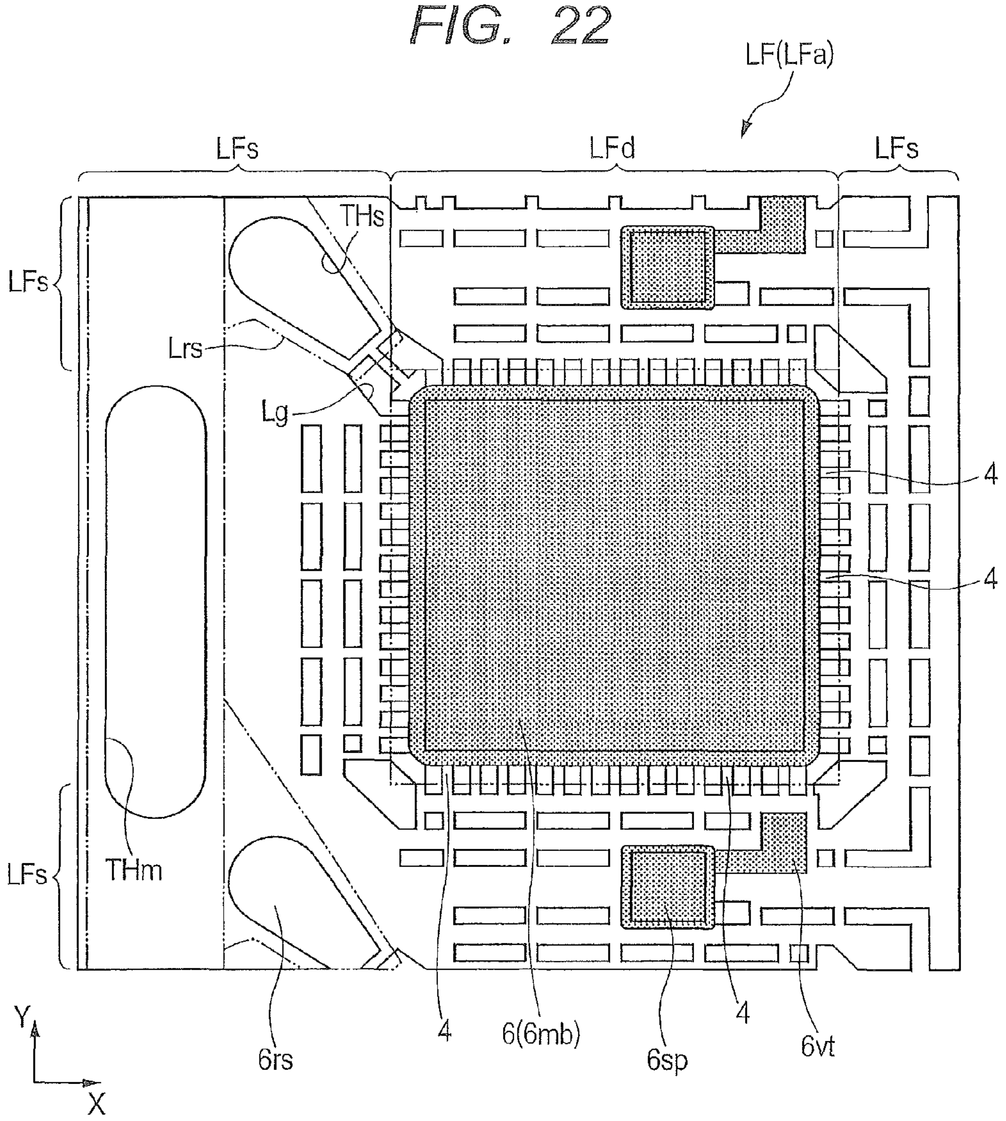
FIG. 22 is an enlarged plan view after removal of the in-dam resin portion, the in-gate resin portion, and the remaining portion of the sub-runner sealing portion shown in FIG. 18.

7. Resin Removal Step (Laser Exposure Step):

Next, as the resin removal step shown in FIG. 5, the in-dam resin portion 6*dm* shown in FIG. 18 is removed. FIG. 22 is an enlarged plan view after removal of the in-dam resin portion, the in-gate resin portion, and the remaining portion of the sub-runner sealing portion shown in FIG. 18.

In the present step, as shown in FIG. 22, the periphery of the device sealing portion 6*mb* of the leadframe LF is exposed to a laser light to remove the in-dam resin portion 6*dm* (refer to FIG. 18). In the present step, the in-gate resin portion 6*g* (refer to FIG. 18) buried in the gate portion Lg is also removed. When a portion of the sub-runner sealing portion 6*rs* remains as shown in FIG. 18, this remaining portion can be removed by exposing it to a laser light in this step.

By conducting the present step, a portion of the side surface of the lead 4 exposed from the device sealing portion 6*mb* at the peripheral portion of the device sealing portion 6*mb* is exposed from the sealing body 6. This improves mounting intensity because a portion of the side surface of the lead 4 can be connected with a soldering material when the semiconductor device 1 shown in FIG. 1 is mounted on a mounting board.

In the present step, improvement in positioning accuracy is preferred for exposing to a laser light with good positional accuracy. According to the present embodiment, inclination of the stacked leadframes LF can be suppressed in the frame stacking step shown in FIG. 5. In the frame stack releasing step shown in FIG. 5, each of the adsorption retention portion CDb shown in FIG. 21 can certainly be brought into contact with the upper surface 6*a* of the device sealing portion 6*mb*. As a result, in this step, the positioning accuracy of the leadframe can be improved.

8. Plating Step:

As the plating step shown in FIG. 5, a metal film SD (refer to FIG. 3) is formed on the surface of the leads 4 shown in FIG. 22 exposed from the device sealing portion 6*mb*. In the present step, a metal film SD (refer to FIG. 3) made of, for example, a solder is formed on the surface of a metal member exposed from the resin, for example, by electroplating.

Figure 23:
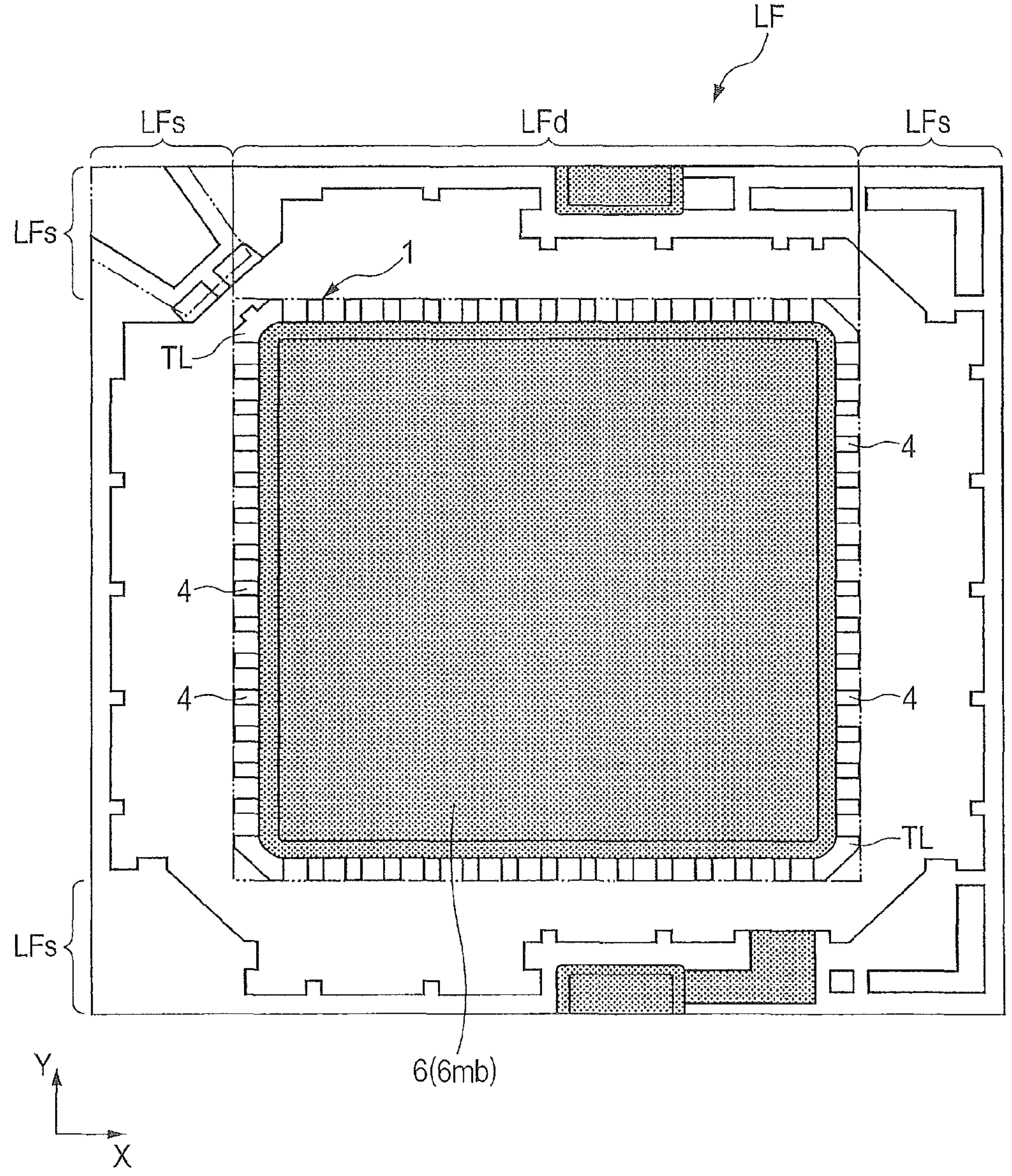
FIG. 23 is an enlarged plan view showing a device forming portion obtained by singulation in the singulation step shown in FIG. 5.

9. Singulation Step:

Next, as the singulation step shown in FIG. 5, the frame portion LFs to which the leads 4 and the suspending leads TL have been linked is cut into individual device forming portions LFd. FIG. 23 is an enlarged plan view showing a device forming portion obtained by singulation in the singulation step shown in FIG. 5.

In the present step, the leads 4 and the suspending leads TL are each separated from the frame portion LFs by pressing, for example, with an unillustrated punch (cutting punch, cutting blade) and die (pressing member, a die) which are press dies (dies) for cutting.

After the present step, necessary check or test such appearance check or electrical test is conducted and a semiconductor device that passes the check or test is regarded as a finished semiconductor device 1 shown in FIG. 1. The semiconductor device 1 is then shipped or mounted on an unillustrated mounting board.

Modification Example

The invention made by the present inventors has been described specifically based on the embodiment. It is needless to say that the invention is not limited to the above-mentioned embodiment but can be changed in various ways without departing from the scope of the invention.

Modification Example 1

For example, in the above embodiment, described is a QFN type in which a portion of a plurality of leads 4 slightly (about 0.3 mm) protrudes outward at four main sides of a rectangular sealing body 6 in plan view. As a modification example of it, for example, the protruding portion of the lead 4 from the sealing body 6 shown in FIG. 1 may be cut. As another modification example, the length of the lead 4 protruding from the sealing body 6 is increased and bending processing toward a mount surface is given to it. Such an example can also be applied to a so-called QFP (quad flat package) type semiconductor device.

Modification Example 2

For example, in the sealing step in the above embodiment, a sealing system while inserting the resin film 53 between the leadframe LF and the lower mold 52 was described. As a modification example, the sealing can be conducted by using a system of bringing the leadframe LF into contact with the lower mold 52 without inserting the resin film 53.

Modification Example 3

For example, in the present embodiment, in the frame stacking step or frame stack releasing step shown in FIG. 5, the method of adsorbing and retaining the leadframes LF by bringing the adsorption retention portions CDb into contact with the device sealing portions 6*mb*, respectively, as shown in FIG. 21 has been described as a retaining method of the leadframes LF in a carrier device. As a modification example, however, for example, a method of retaining the leadframes LF by sandwiching the side surface of the outer frame of them shown in FIG. 1 with an unillustrated holding jig (chuck) can be used. Even if such a retaining method is used, inclined leadframes LF cannot certainly be retained. Application of the technology described in the above embodiment however suppresses inclination of each of the leadframes LF even when the leadframes LF are stacked one after another. The leadframes can be retained stably even if the above-mentioned modification example is employed.

Modification Example 4

For example, in the above-mentioned embodiment, the frame stacking step and the frame stack releasing step were described before and after the baking step, respectively, as a typical example. The frame stacking step and the frame stack releasing step can also be conducted as a step independent of the baking step.

Modification Example 5

Moreover, the modification examples can be used in combination without departing from the scope of the technical concept described in the above embodiment.

What is claimed is:

1. A method of manufacturing a semiconductor device, comprising the steps of:

(a) providing a lead frame including:
- (a1) a frame portion, including:
  - (a11) a through hole penetrating the lead frame,
- (a2) a device forming portion surrounded by the frame portion in plan view, including:
  - (a21) a die pad, and
  - (a22) a semiconductor chip mounted on the die pad;

(b) after the step (a), sealing the semiconductor chip with sealing resin by supplying the sealing resin to the device forming portion via a first region of the frame portion in which the through hole is formed in plan view, thereby forming a sealing body sealing the device forming portion and the first region of the frame portion; and (c) after the step (b), removing a first part of the sealing body located at the first region of the frame portion from the lead frame by inserting a pin into the through hole, wherein in plan view, the through hole has a pair of sides that extend divergently from a first end portion of the through hole toward an arcuate second end portion of the through hole such that the first end portion is located closer than the arcuate second end portion to the device forming portion.

2. The method according to claim 1, wherein the pin includes an end surface having a circular shape in plan view.

3. The method according to claim 1, wherein the sealing resin has no bromine (Br)-based flame retardant.

4. The method according to claim 1, wherein the first region is reached to the device forming portion from an edge of the lead frame in plan view, and wherein the through hole is the nearest hole in the first region.

* * * * *